(12) United States Patent
Tsuchi

(10) Patent No.: US 8,922,540 B2
(45) Date of Patent: Dec. 30, 2014

(54) OUTPUT CIRCUIT, DATA DRIVER, AND DISPLAY DEVICE

(75) Inventor: Hiroshi Tsuchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 288 days.

(21) Appl. No.: 13/612,671

(22) Filed: Sep. 12, 2012

(65) Prior Publication Data

US 2013/0088473 A1    Apr. 11, 2013

(30) Foreign Application Priority Data

Oct. 7, 2011    (JP) .................................. 2011-222978

(51) Int. Cl.
| | |
|---|---|
| G06F 3/038 | (2013.01) |
| G09G 5/00 | (2006.01) |
| G09G 3/32 | (2006.01) |
| H03F 3/30 | (2006.01) |
| H03F 3/45 | (2006.01) |
| G09G 3/36 | (2006.01) |

(52) U.S. Cl.
CPC ............ *G09G 3/3275* (2013.01); *H03F 3/3022* (2013.01); *H03F 3/45085* (2013.01); *G09G 3/3688* (2013.01); *H03F 2200/78* (2013.01); *H03F 2203/45506* (2013.01); *H03F 2203/45646* (2013.01); *H03F 2203/45648* (2013.01); *H03F 2203/45726* (2013.01); *G09G 2310/0291* (2013.01)
USPC .......................................... 345/211; 345/204

(58) Field of Classification Search
CPC .................... G09G 2310/0291; G09G 3/3275; H03F 2200/78; H03F 2203/45646; H03F 2203/45648; H03F 2203/45726
USPC .................................................. 345/204, 211
See application file for complete search history.

(56) References Cited

U.S. PATENT DOCUMENTS 5,311,145 A    5/1994    Huijsing et al.

FOREIGN PATENT DOCUMENTS

JP    6-326529 A    11/1994

OTHER PUBLICATIONS 6.6L:Late-News Paper: "A Low Quiescent Current and Fast Settling Output Buffer with Boosting Slew-rate Scheme for Large LCD driver", II Kwon Chang et al., SID 10 Digest pp. 74-76, 2010.

*Primary Examiner* — Viet Pham
(74) *Attorney, Agent, or Firm* — McGinn IP Law Group, PLLC

(57) ABSTRACT

An output circuit is capable of supporting a high-speed operation, suppressing power consumption, and controlling its area. The output circuit has a differential input stage, an output amplification stage, and an amplification boost circuit, in which the amplification boost circuit has a differential pair of a second conductivity type and load element pair, and includes a first current source circuit for controlling current supply to an input node of a second current mirror circuit of the differential input stage and boost the charging operation of the output amplification stage according to a voltage difference between input and output voltages, and a second current source circuit for controlling current supply to an output node of a first current mirror circuit of the differential input stage and boost the discharging operation of the output amplification stage.

22 Claims, 13 Drawing Sheets

OUTPUT CIRCUIT, DATA DRIVER, AND DISPLAY DEVICE

CROSS-REFERENCE TO RELATED APPLICATIONS

The disclosure of Japanese Patent Application No. 2011-222978 filed on Oct. 7, 2011 including the specification, drawings and abstract is incorporated herein by reference in its entirety.

BACKGROUND

The present invention relates to an output circuit, a data driver using it, and a display device.

Currently, among display devices, the liquid crystal display device (LCD) that features a thin form, a light weight, and low power consumption spreads broadly, and find its uses not only in the laptop PC and the monitor, but also in the large screen liquid crystal television, the multifunctional cellular phone, the tablet type highly sophisticated information terminal, etc. As these liquid crystal display devices, many liquid crystal display devices of the active matrix drive system each of which can perform a high definition display are used. Moreover, as a thin display device which ranks second to the liquid crystal display device, development of a display device of the active matrix drive system using an organic light-emitting diode (OLED) that features light-emitting by itself and a clear image quality is also being advanced.

With reference to FIG. 12, a typical configuration of the thin display device of the active matrix drive system (the liquid crystal display device and an organic light-emitting diode display device) will be outlined. Incidentally, FIG. 12A shows a principal part configuration of the thin display device by a block diagram, FIG. 12B shows a principal part configuration of a unit pixel of a display panel of the liquid crystal display device, and FIG. 12C shows a principal part configuration of a display panel of the organic light-emitting diode display device, respectively. The unit pixels of FIG. 12B and FIG. 12C are represented by schematic equivalent circuits, respectively.

Referring to FIG. 12A, generally, the thin display device of the active matrix drive system is comprised of a power supply circuit 940, a display controller 950, a display panel 960, a gate driver 970, and a data driver 980. In the display panel 960, the unit pixels each containing a pixel switch 964 and a display element 963 are arranged in a matrix form (for example, in the case of a color SXGA (Super eXtended Graphics Array) panel, 1280×3 pixel column×1024 pixel row), and a scanning line 961 for sending a scanning signal outputted to each unit pixel from the gate driver 970 and a data line 962 for sending a gradation voltage signal outputted from the data driver 980 are wired in a grid form. Incidentally, the display controller 950 controls the gate driver 970 and the data driver 980, respectively, and supplies clock CLK, control signal, etc. that are required respectively, and image data is supplied to the data driver 980 in a digital signal. The power supply circuit 940 supplies electrical power necessary for the gate driver 970 and the data driver 980. The display panel 960 is comprised of a semiconductor substrate, and especially in a large screen display device, a semiconductor substrate such that pixel switches etc. are formed with thin film transistors (TFTs) over an insulating substrate, such as a glass substrate and a plastic substrate, is widely used.

The above-mentioned display devices controls on/off of the pixel switch 964 by a scanning signal, and when the pixel switch 964 is turned on, it displays an image by applying the gradation voltage signal corresponding to the image data to the display element 963 to effect variation in brightness of the display element 963 according to the gradation voltage signal.

Rewriting of the data for one screen is performed every one frame period (usually about 0.017 sec at the time of 60-Hz driving), selection (the pixel switch is turned on) is performed sequentially for every one pixel line (each line) by each scanning line 961, and each data line 962 supplies the gradation voltage signal to the display element 963 through the pixel switch 964 in a selection period. Incidentally, there are cases where multiple pixel lines with corresponding multiple lines are selected simultaneously or where the scanning line is driven at 120 Hz or at a higher frame frequency in order to improve a motion picture characteristic.

In the case of the liquid crystal display device, referring to FIG. 12A and FIG. 12B, the display panel 960 is comprised of a structure of a semiconductor substrate over which the pixel switches 964 and transparent pixel electrodes 973, as the unit pixels, are arranged in a matrix form, an opposing substrate over the whole plane of which a single transparent electrode 974 is formed, and liquid crystal enclosed between these two substrates being opposed. Incidentally, the display element 963 forming the unit pixel has a pixel electrode 973, an opposing substrate electrode 974, a liquid crystal capacitance 971, and an auxiliary capacitance 972. Moreover, it has a backlight over the back of the display panel as a luminous source.

When the pixel switch 964 is turned on (conduction) by the scanning signal from the scanning line 961, the gradation voltage signal from the data line 962 is applied to the pixel electrode 973, the transmissivity of the light from the backlight penetrating the liquid crystal varies by the potential difference between each pixel electrode 973 and the opposing substrate electrode 974, and even after the pixel switch 964 is turned off (non-conduction), the potential difference is maintained for a fixed period by the liquid crystal capacitance 971 and the auxiliary capacitance 972, whereby display is performed.

Incidentally, in driving of the liquid crystal display device, in order to prevent degradation, of the liquid crystal, a drive (inversion driving) whereby voltage polarity (positive or negative) of the pixel electrode 973 is switched to the common voltage of the opposing substrate electrode 974, usually with one frame period, is performed. As typical examples, there are dot inversion driving where the voltage has a different voltage polarity between adjacent pixels and column inversion driving where the voltage has a different voltage polarity between adjacent pixel columns. In the dot inversion driving, the gradation voltage signal of a different voltage polarity is outputted to one data line for each selection period (one data period); in the column inversion driving, the gradation voltage signal is outputted with the same voltage polarity in each selection period (data period) in the one frame period but with a different voltage polarity in each frame period.

In the case of the organic light-emitting diode display device, referring to FIG. 12A and FIG. 12C, the display panel 960 is comprised of a semiconductor substrate over which the pixel switch 964, an organic light-emitting diode 982 made of an organic film sandwiched by two thin-film electrode layers and thin film transistors (TFTs) 981 each for controlling a current supplied to the organic light-emitting diode 982 (these two members serving as the unit pixel), are arranged in a matrix form. The TFT 981 and the organic light-emitting diode 982 are coupled together in series between the power supply terminal 984 and the power supply terminal 985 (cathode electrode) to which different power supply voltages are supplied, and further have an auxiliary capacitance 983 for maintaining a control terminal voltage of the TFT 981. Incidentally, the display element 963 corresponding to one pixel is comprised of the TFT 981, the organic light-emitting diode 982, power supply terminals 984, 985, and the auxiliary capacitance 983.

Display is performed as follows: when the pixel switch 964 turns on (conduction) by the scanning signal from the scanning line 961, the gradation voltage signal from the data line 962 is applied to a control terminal of the TFT 981; a current corresponding to the gradation voltage signal is supplied to the organic light-emitting diode 982 by the TFT 981; and the organic light-emitting diode 982 emits light at a brightness according to the current. Even after the pixel switch 964 is turned off (non-conduction), light emission is held by maintaining the gradation voltage signal applied to the control terminal of the TFT 981 for a fixed period with the auxiliary capacitance 983. Incidentally, although the pixel switch 964 and the TFT 981 show an example of n-channel type transistors, it is also possible for them to be comprised of p-channel type transistors. Moreover, a configuration in which the organic light-emitting diode is coupled to a power supply terminal 984 is also possible. Moreover, in driving of the organic light-emitting diode display device, inversion driving like in the liquid crystal display device is not necessary, and the gradation voltage signal corresponding to the pixel is outputted to the data line 962 at every selection period (one data period).

Incidentally, although the organic light-emitting diode display device also has a configuration in which display is performed by receiving a gradation current signal outputted from the data driver, aside from the above-explained configuration in which display is performed by receiving the gradation voltage signal from the data line 962, an explanation in this description will be given limiting to the configuration in which display is performed by receiving the gradation voltage signal outputted from the data driver.

In FIG. 12A, while the gate driver 970 must just supply the scanning signal of at least binary, the data driver 980 is required to drive each data line 962 with the gradation voltage signal of multi-valued levels according to the number of gradation. Consequently, the data driver 980 has an output circuit for amplifying and outputting the gradation voltage signal corresponding to the image data to the data line 962.

In high-end use mobile apparatuses, laptop PCs, monitors, televisions, etc each of which has a thin display device, a demand for higher definition is being sought. Specifically, the following requests have started to be placed: a request of multi-color rendering (higher gradation) more than or equal to 8-bit image data for each color of RGB (about 16,800,000 colors); and a request of increasing the frame frequency (driving frequency at which one screen is rewritten) to 120 Hz or more higher than this in order to improve a motion picture characteristic and to support three-dimensional representation. If the frame frequency becomes N times larger, one data output period will be about 1/N times smaller.

The data driver of the display device has become asked to perform high-speed driving of the data line together with a high-precision voltage output that corresponds to increased gray scales. Therefore, in order to charge and discharge the data line capacitance at high speed, an output circuit of the data driver 980 is required to have a high driving capability. Moreover, in order to attain uniformity in writing of the gradation voltage signal to the display element, symmetry of a slew rate of a data line driving waveform at the time of charging and discharging is also required. However, the output circuit has an increased consumption current with its higher driving capability. Consequently, problems of an increase in power consumption and generation of heat are newly brought forward.

Next, with reference to FIG. 11, an output range of the data driver for display will be explained. Incidentally, FIG. 11 is a drawing created by the inventors of this application in order to explain problems of a pertinent art. FIG. 11A shows the output range of an LCD driver. VDD and VSS denote a high-level power supply voltage and a low-level power supply voltage, respectively (generally VSS is a ground potential=0 V). The LCD driver performs a polarity inversion driving of a positive voltage (high potential side) and a negative voltage (low potential side) to a common voltage COM of an opposing substrate electrode that is near the medium of the power supply voltages VDD and VSS.

FIG. 11B shows an output range of the OLED driver of active matrix drive (of voltage program type). The OLED driver has no polarity inversion drive as in the LCD. FIG. 11B shows an example in which the output range is (VSS+Vdif) to VDD. A voltage difference Vdif is governed by a potential difference between electrodes required for an OLED element formed over the display panel to emit light and a threshold voltage of a transistor over the display panel for controlling a current supplied to the OLED element.

One example of the pertinent art of driving the data line of the display device at high speed will be explained below. FIG. 13 is a diagram cited from FIG. 3 of 6.6L: Late-News Paper: A Low Quiescent Current and Fast Settling Output Buffer with Boosting Slew-rate Scheme for Large LCD driver, II Kwon Chang et al., SID 10 DIGEST, pp. 74-76, 2010. FIG. 13 discloses an output buffer that boosts the slew rate to aim at shortening of a settling time and attaining lower power consumption as an output buffer of the data driver for display (a large-sized LCD driver). In FIG. 13, the output buffer is formed by having a differential amplifier 700 (excluding an SEC 710) and the slew rate boost circuit (SBC: Slew Boosting Circuit) 710 for boosting the slew rate according to a difference between an input voltage and an output voltage. Incidentally, the differential amplifier 700 of FIG. 13 has a configuration based on Japanese Unexamined Patent Publication No. Hei6 (1994)-326529.

Referring to FIG. 13, the differential amplifier 700 has: a current source IN1 whose one end is coupled to a low potential side power supply terminal (a GND terminal); Nch transistors N1, N2 whose sources are coupled in common to the other end of the current source IN1, whose gates are coupled to an input terminal INP and an output terminal OUT, respectively, and that form an Nch differential pair; a current source IP1 whose one end is coupled to a high potential side power supply terminal (power supply terminal); Pch transistors P1, P2 whose sources are coupled in common to the other end of the current source IP1, whose gates are coupled to the input terminal INP and the output terminal OUT, respectively, and that form a Pch differential pair; Pch transistors P3, P4 whose sources are coupled to the power supply terminal and whose gates were coupled to each other; a Pch cascode current mirror (P3 to P6) that is comprised of the Pch transistors P5, P6 whose sources are coupled to drains of the Pch transistors P3, P4, respectively, whose gates are coupled to each other, and whose common gates are coupled to a drain of the Pch transistor P5, and such that a coupling point of the Pch transistors P3, P5 and a coupling point of the Pch transistors P4, P6 are coupled to drains of the Nch transistors N1, N2, respectively; Nch transistors N3, N4 whose sources are coupled to the GND terminal and whose gates were coupled to each other; a Nch cascode current mirror (N3 to N6) that is comprised of the Nch transistors N5, N6 whose sources are coupled to drains of the Nch transistors N3, N4, respectively, whose gates are coupled to each other, and such that common gates of the Nch transistors N3, N4 are coupled to a drain of the Nch transistor N5, and a coupling point of the Nch transistors N3, N5 and a coupling point of the Nch transistors N4, N6 are coupled to drains of the Pch transistors P1, P2, respectively; a communication circuit V1. (a voltage source) coupled between the drain of the Pch transistor P5 (an input node of the Pch cascode current mirror (P3 to P6)) and the drain of the Nch transistor N5 (an input node of the Nch cascode current mirror (N3 to N6); and a communication circuit V2 (a voltage source) coupled between a drain of the Pch transistor P6 (an output node of the Pch cascode current mirror (P3 to P6)) and a drain of the Nch transistor N6 (an output node of the Nch cascode current mirror (N3 to N6). As an output stage, the differential amplifier 700 has a Pch transistor P0 whose source is coupled to the power supply terminal, whose drain is coupled to an output terminal OUT, and whose gate is coupled to a coupling node of the output (a drain of P6) of the Pch cascode current mirror (P3 to P6) and the communication circuit V2, and an Nch transistor N0 whose source is coupled to the GND terminal, whose drain is coupled to the output terminal OUT, and whose gate is coupled to the coupling node of the output (the drain of N6) of the Nch cascode current mirror (N3 to N6) and the communication circuit V2. The differential amplifier 700 of FIG. 13 is a Rail-to-Rail differential amplifier capable of a voltage follower operation in an almost full range of voltages between the high-level power supply and the GND.

The slew rate boost circuit (SBC) 710 has: a current source IN11 whose one end is coupled to the GND terminal; Nch transistors N11, N12 whose sources are coupled to the other end of the current source IN11 in common, whose gates are coupled to the input terminal INP and the output terminal OUT, respectively, and that serve as an Nch differential pair; a current source IP11 whose one end is coupled to the power supply terminal; Pch transistors P11, P12 whose sources are coupled to the other end of the current source IN11 in common, whose gates are coupled to the input terminal INP and the output terminal OUT, respectively, and that serve as a Pch differential pair; Pch transistors P13, P14 that are coupled between drains (an output pair of the Nch differential pair) of the Nch transistors N11, N12 and the power supply terminal and receives a bias voltage VP1 at their gates; a Pch transistor P15 whose source is coupled to the power supply terminal and whose gate is coupled to gates of the Pch transistors P13, P14; a Pch transistor P16 whose source is coupled to a drain of the Pch transistor P15, whose gate is coupled to a coupling node of the drain of the Pch transistor P13 and the drain of the Nch transistor N11, and whose drain is coupled to a coupling node PI of the input node (drain of N5) of the Nch cascode current mirror and the communication circuit V1; Nch transistors N13, N14 that are coupled between drains (an output pair of the Pch differential pair) of the Pch transistors P11, P12 and the GND terminal, and receives a bias voltage VN1 at their gates; an Nch transistor N15 whose source is coupled to the GND terminal and whose gate is coupled to gates of the Nch transistors N13, N14; and an Nch transistor N16 whose source is coupled to a drain of the Nch transistor N15, whose gate is coupled to a coupling point of a drain of the Nch transistor N13 and a drain of the Pch transistor P11, and whose drain is coupled to a coupling node NI of the input node (the drain of P5) of the Pch cascade current mirror and the communication circuit V1.

The transistors P13, P14, and P15 that receive the bias voltage VP1 at their gates and the transistors N13, N14, and N15 that receive the bias voltage VN1 at their gates form respective current sources. The transistors P16, N16 form respective switches.

An action of the slew rate boost circuit (SBC) 710 will be explained below.

When the voltage of the input terminal INP becomes higher than the voltage of the output terminal OUT, drain currents of the Nch transistors N11, N12 that form the Nch differential pair of the slew rate boost circuit (SBC) 710 increase and decrease, respectively. Then, when a drain current of the Nch transistor N11 becomes larger than a current set by the Pch transistor P13, the potential of a coupling node of the Nch transistor N11 and the Pch transistor P13 falls. As a result, the Pch transistor P16 turns on, and the current set by the Pch transistor P15 is supplied to the node PI. This increases both the input currents (drain currents of N3 and N5) of the Nch cascode current mirror (N3 to N6) of the differential amplifier 700 and the output currents (drain currents of N4 and N6), and boosts reduction actions of the gate potentials of the output stage transistors P0 and N0.

Thus, addition of the action of the slew rate boost circuit (SBC) 710 to an amplifying action of the differential amplifier 700 boosts the charging operation of the output terminal OUT. Incidentally, when the voltage of the output terminal OUT approaches the voltage of the input terminal INP, the drain current of the Nch transistor N11 decreases, the Pch transistor P16 turns off, and current supply from the Pch transistor P15 to PI is stopped. The action of the slew rate boost circuit (SBC) 710 stops and a voltage variation of the output terminal OUT is caused only by the amplifying action of the differential amplifier 700.

Moreover, when the voltage of the input terminal INP becomes higher than the voltage of the output terminal OUT, drain currents (absolute values) of the Pch transistors P11, P12 that form the Pch differential pair of the slew rate boost circuit (SBC) 710 decrease and increase, respectively. However, since the coupling node of the Pch transistor P11 and the Nch transistor N13 receives a potential reducing action, the Nch transistor N16 is kept to be off and does not affect the amplifying action of the differential amplifier 700.

On the other hand, when the voltage of the input terminal INP becomes lower than the voltage of the output terminal OUT, the drain currents (absolute values) of the Pch transistors P11, P12 that form the Pch differential pair of the slew rate boost circuit (SBC) 710 increase and decrease, respectively.

Then, when the drain current (absolute value) of the Pch transistor P11 becomes larger than a current set by the Nch transistor N13, the Nch transistor N16 turns on, and the current set by the Nch transistor N15 is supplied to the node NI.

This increase both the input currents (drain currents (absolute values) of P3 and P5) of the Pch cascode current mirror of the differential amplifier 700 and the output currents (drain currents (absolute values) of P4 and P6), and boosts raising actions of the gate potentials of the output stage transistors P0, N0. Therefore, addition of the action of the slew rate boost circuit (SBC) 710 to the amplifying action of the differential amplifier 700 boosts the discharging operation of the output terminal OUT.

Incidentally, when the voltage of the output terminal OUT approaches the voltage of the input terminal INP, a drain current of the Pch transistor P11 decreases, the Nch transistor N16 turns off, and current supply from the Nch transistor N15 to the node NI is stopped. The action of the slew rate boost circuit (SBC) 710 stops and the voltage variation of the output terminal OUT is caused only by the amplifying action of the differential amplifier 700. Moreover, when the voltage of the input terminal INP becomes lower than the voltage of the output terminal OUT, drain currents (absolute values) of the Nch transistors N11, N12 that form the Nch differential pair of the slew rate boost circuit (SBC) 710 decrease and increase, respectively. However, at this time, the Pch transistor P16 is kept to be off (non-conduction), and does not affect the amplifying action of the differential amplifier 700.

SUMMARY

Analyses of a pertinent art will be given below.

A circuit shown in FIG. 13 has a problem of a substantially increased area because, in addition to a differential amplifier 700, two differential pairs (N11, N12), (P11, P12) of a slew rate boost circuit (SBC) 710, eight transistors (IN11, IP11, P13 to P15, N13 to N15) that form a current source and two transistors (P16, N16) that form switches are added.

Therefore, objects of the present invention is to provide an output circuit made capable of supporting a high-speed operation and of suppressing its power consumption and area, a data driver having the output circuit, and a display device.

According to the present invention, although not restricted to these in particular, it shall have an outline configuration as follows. Incidentally, reference symbols of respective components are given corresponding to the drawings in order just to make understanding of the present invention easy, and naturally, they should not be interpreted as what are for limiting the present invention.

According to the present invention, there is provided an output circuit that has a differential input stage 10, and an output amplification stage 20, an amplification boost circuit 70, an input terminal 1, an output terminal 2, and first to fifth power supply terminals E1 to E5, in which the differential input stage 10 has: a first differential pair 11 having a transistor pair for inputting therein an input signal of the input terminal and an output signal of the output terminal in a differential mode; a first current source 113 for driving the first differential pair; a first current mirror 30 including a transistor pair (131, 132) of a first conductivity type that is coupled between the first power supply terminal E1 and first and second nodes N1, N2 and receives an output current of the first differential pair; a second current mirror 40 including a transistor pair of a second conductivity type that is coupled between the second power supply terminal E2 and third and fourth nodes N3, N4; a first floating current source circuit 50 coupled between the second node N2 to which an input of the first current mirror 30 is coupled and the fourth node N4 to which an input of the second current mirror 40 is coupled; and a second floating current source circuit 60 coupled between the first node N1 to which an output of the first current mirror 30 is coupled and the third node N3 to which an output of the second current mirror 40 is coupled; in which the output amplification stage 20 has a first transistor 121 of the first conductivity type that is coupled between the third power supply terminal E3 and the output terminal 2 and whose control terminal is coupled to the first node, and a second transistor 122 of the second conductivity type that is coupled between the fourth power supply terminal E4 and the output terminal 2 and whose control terminal is coupled to the third node, in which the amplification boost circuit 70 has: a second differential pair (171, 172) having a transistor pair that inputs therein an input signal of the input terminal and an output signal of the output terminal in a differential mode, and second and third current sources 176, 178 coupled to the fifth power supply terminal E5, in which when a voltage difference between an output voltage VO of the output terminal 2 and a voltage of the fifth power supply terminal E5 is larger than a previously set first value as compared with a voltage difference between an input voltage VI of the input terminal 1 and the voltage of the fifth power supply terminal E5, the amplification boost circuit 70 deactivates the third current source 178 according to an output of one transistor of the transistor pair whose input is coupled to the output terminal in the second differential pair, activates the second current source 176 according to an output of the other transistor of the transistor pair whose input is coupled to the input terminal in the second differential pair, and combines a current from the second current source to either of a current inputted into a first floating current source circuit 50 or a current outputted from the first floating current source circuit 50, in which when the voltage difference between the input voltage V1 of the input terminal 1 and the voltage of the fifth power supply terminal E5 is larger than a previously set second value as compared with the voltage difference between the output voltage VO of the output terminal 2 and the voltage of the fifth power supply terminal E5, the amplification boost circuit 70 deactivates the second current source 176 according to an output of the other transistor of the transistor pair whose input is coupled to the input terminal in the second differential pair, activates the third current source 178 according to an output of the one transistor of the transistor pair whose input is coupled to the output terminal in the second differential pair, and combines a current form the third current source 178 to either of a current inputted into a second floating current source circuit 60 or a current outputted from the second floating current source circuit 60, and in which when the voltage difference between the output voltage VO of the output terminal 2 and the voltage of the fifth power supply terminal E5 is less than or equal to the first value as compared with the voltage difference between the input voltage VI of the input terminal 1 and the voltage of the fifth power supply terminal E5 and, at the same time, the voltage difference between the input voltage VI of the input terminal 1 and the voltage of the fifth power supply terminal E5 is less than or equal to the second value as compared with the voltage difference between the output voltage VO and the voltage of the fifth power supply terminal E5, the amplification boost circuit 70 controls switching so that both of the second and third current sources 176, 178 may be deactivated.

According to the present invention, the data driver of the display device including the output circuit, and the display device having the data driver are provided.

According to the present invention, the output circuit is made capable of supporting a high-speed operation and is made capable of suppressing power consumption. Moreover, according to the present invention, it is also made possible to suppress the area of the output circuit.

DETAILED DESCRIPTION

Figure 1:
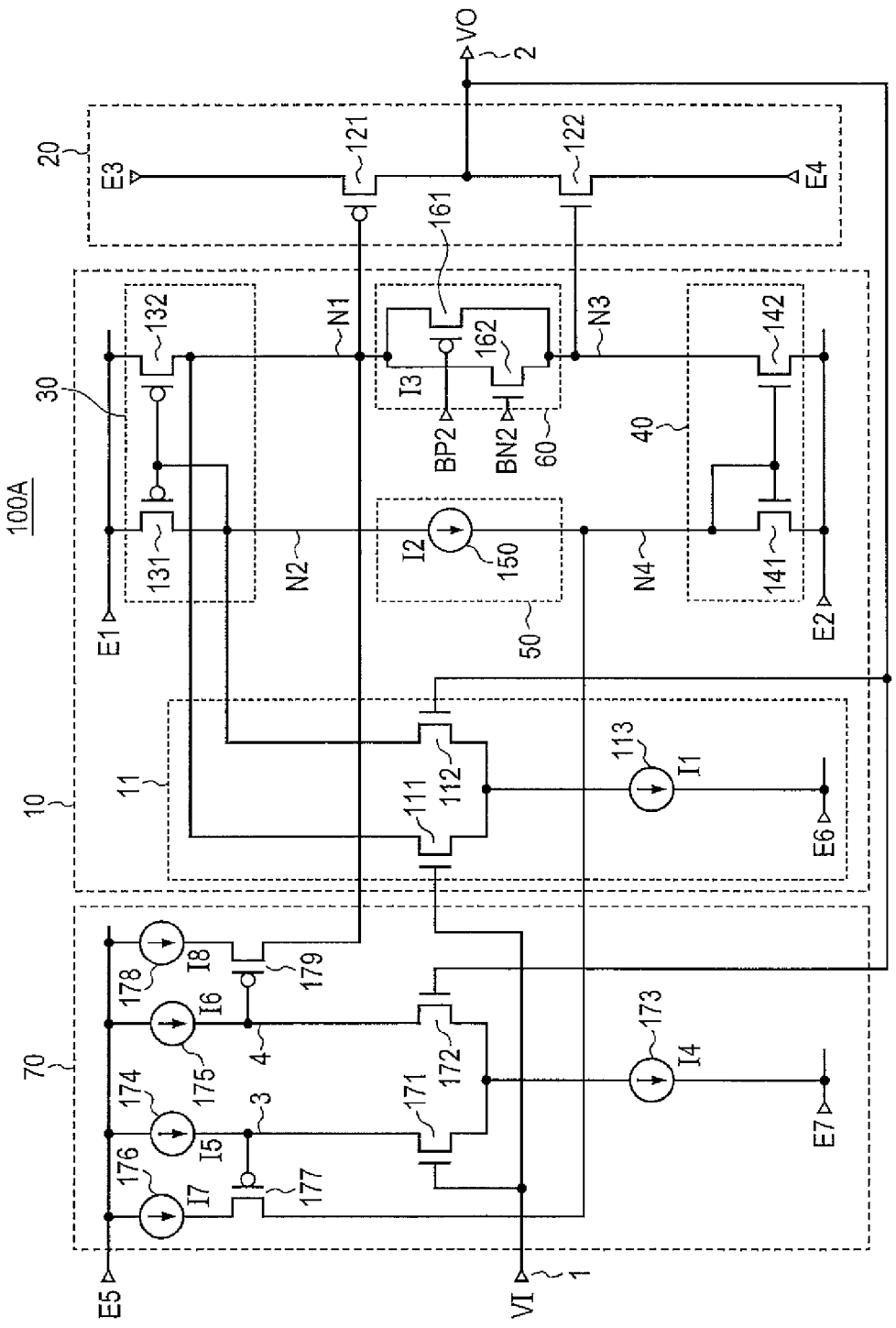
FIG. 1 is a diagram showing a configuration of a first embodiment of the present invention.

Hereinafter, embodiments of the present invention will be described with reference to drawings. In one of preferable modes of the present invention, for example, referring to FIG. 1, an output circuit has an input terminal 1 into which a voltage signal is inputted, an output terminal 2 for outputting a voltage signal, a differential input stage 10, an output amplification stage 20, and an amplification boost circuit 70.

The differential input stage 10 has: a first differential stage 11 for inputting therein an input signal VI of the input terminal 1 and an output signal VO of an output signal 2 in a differential mode; a first current mirror 30 that has two transistors of a first conductivity type (P type) coupled between a first power supply terminal E1 and first and second nodes N1, N2, and receives output currents of an output pair of the first differential stage 11 at the first and second nodes N1, N2; a second current mirror 40 having two transistors of a second conductivity type (N type) coupled between a second power supply terminal E2 and third and fourth nodes N3, N4, a first floating current source circuit 50 coupled between the second node N2 to which an input of the first current mirror 30 is coupled and a fourth node N4 to which an input of the second current mirror 40 is coupled; and a second floating current source circuit 60 coupled between a first node N1 to which an output of the first current mirror 30 is coupled and a third node N3 to which an output of the second current mirror 40 is coupled.

The output amplification stage 20 has a first transistor 121 of the first conductivity type (P-type) that is coupled between a third power supply terminal E3 and the output terminal 2 and whose control terminal is coupled to the first node N1, and a second transistor 122 of the second conductivity type (N-type) that is coupled between a fourth power supply terminal E4 and the output terminal 2 and whose control terminal is coupled to the third node N3.

The amplification boost circuit 70 has: a second differential stage (a differential pair (171, 172) and a current source 173) that inputs therein the input signal VI of the input terminal 1 and the output signal VO of the output terminal 2 in a differential mode; a first load element pair (174, 175) coupled between a fifth power supply terminal E5 and an output pair of the second differential stage; a second current source 176 and a third transistor 177 that are coupled in series between the fifth power supply terminal 85 and a previously determined node on the input side of the second current mirror (the node N4 or a first terminal (a source terminal) of a transistor 143 whose second terminal (a drain terminal) is coupled to the node N4); and a third current source 178 and a fourth transistor 179 that are coupled in series between the fifth power supply terminal 85 and a previously determined node (the node N1) on the output side of the first current mirror. A control terminal (a gate terminal) of the third transistor 177 is coupled to a coupling point 3 of one output (a drain of the Nch transistor 171) of the output pair of the second differential stage and one element 174 of the first load element pair. A control terminal (a gate terminal) of the fourth transistor 179 is coupled to a coupling point 4 of the other output of the output pair of the second differential stage and the other element 175 of the first load element pair.

Figure 4:
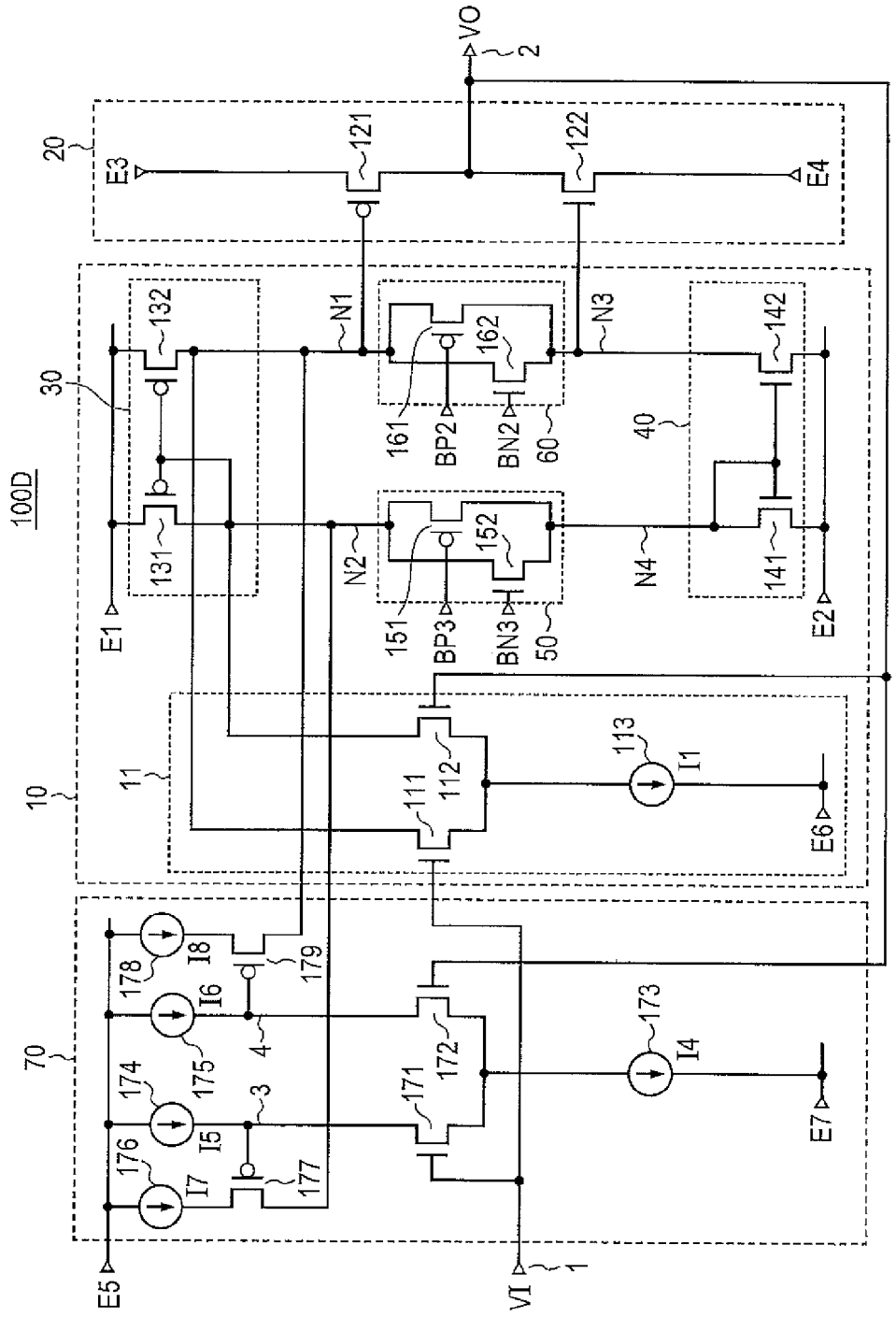
FIG. 4 is a diagram showing a configuration of a fourth embodiment of the present invention.

Alternatively, for example, referring to FIG. 4, the amplification boost circuit 70 has: a second differential stage (the differential pair (171, 172) and the current source 173) that inputs therein the input signal VI of the input terminal 1 and the output signal VO of the output terminal 2 in a differential mode; the first load element pair (174, 175) coupled between the fifth power supply terminal E5 and the output pair of the second differential stage; the second current source 176 and the third transistor 177 coupled in series between the fifth power supply terminal E5 and a previously determined node on the input side of the first current mirror (the node N2 or a first terminal (a source terminal) of a transistor 133 whose second terminal (a drain terminal) is coupled to the node N2); and the third current source 178 and the fourth transistor 179 coupled in series between the fifth power supply terminal E5 and a previously determined node (the node N1) on the output side of the first current mirror. The control terminal (the gate terminal) of the third transistor 177 and the control terminal (the gate terminal) of the fourth transistor 179 are coupled to a coupling point pair (3, 4) of the output pair of the second differential stage and the first load element pair (174, 175). Hereinafter, output circuits according to the present invention will be explained based on several embodiments.

First Embodiment

Figure 12B:
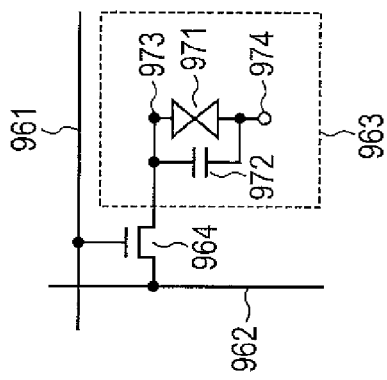
FIG. 12B is a diagram showing a pixel of the LCD in an equal circuit.
Figure 12C:
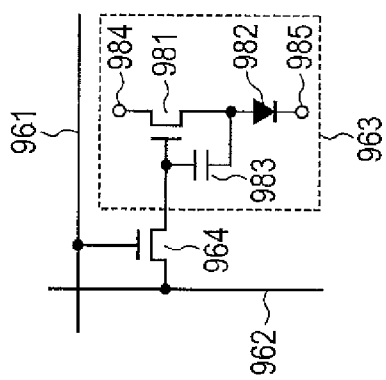
FIG. 12C is a diagram showing a pixel of the OLED similarly.
Figure 12A:
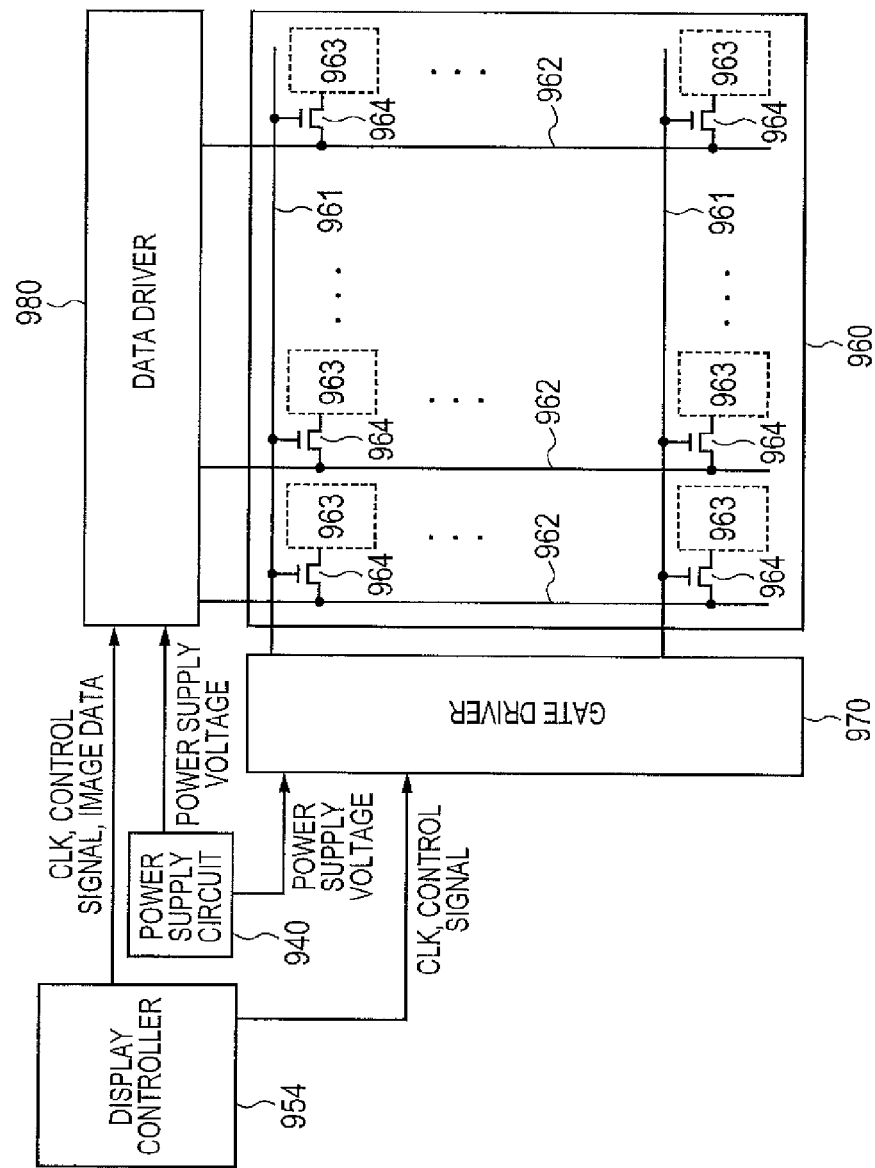
FIG. 12A is a diagram showing a configuration of the display device.

FIG. 1 is a diagram showing a configuration of an output circuit 100A of a first embodiment of the present invention. In this embodiment, the output circuit 100A drives a wire load. A Pch MOS transistor and an Nch MOS transistor are abbreviated as a "Pch transistor" and an "Nch transistor," respectively. For example, a data line (962 of FIG. 12A) of the display device is coupled to the output terminal 2 of FIG. 1. As shown in FIG. 1, the output circuit 100A has the differential input stage 10 that receives an input voltage VI of the input terminal 1 and an output voltage VO of the output terminal 2 in a differential mode, the output amplification stage 20 that receives first and second outputs (nodes N1, N3) of the differential input stage 10 and outputs the output voltage VO according to the input voltage VI from the output terminal 2 by a push-pull operation, and the amplification boost circuit 70 that detects a voltage difference between the input voltage VI and the output voltage VO and boosts amplification operations of the differential input stage 10 and the output amplification stage 20 according to the voltage difference.

In this embodiment, the output voltage of the output terminal 2 is fed back to an inverting input terminal of the differential input stage 10, and the output circuit 100A is configured to be a voltage follower that varies following the input voltage VI of a non-inverting input terminal of the differential input stage 10 in phase (each of the following embodiments is also specified similarly).

The differential input stage 10 has the first differential stage 11, the first current mirror (the Pch current mirror) 30, the second current mirror (the Nch current mirror) 40, and the first and second floating current source circuits 50, 60.

The first differential stage 11 has Nch transistors 111, 112 whose sources are coupled in common and whose gates are coupled to an input terminal 1 to which the input voltage VI is supplied and the output terminal 2 from which the output voltage VO is outputted and that form the Nch differential transistor pair, and the current source 113 whose one end is coupled to a sixth power supply terminal E6 for giving a low-level power supply voltage and whose other end is coupled to the commonly coupled sources of the Nch differential pair (111, 112).

The first current mirror 30 has a Pch transistor pair (131, 132) whose sources are coupled in common to the first power supply terminal E1 for giving a high-level power supply voltage and whose drains are coupled to the first node N1 and the second node N2, respectively. Gates of the Pch transistor pair (131, 132) are coupled in common, and the commonly coupled gates are coupled to the node N2 that is a drain node of the Pch transistor 131. The first and second nodes N1, N2 are designated as an output node and an input node of the current mirror 30, respectively. The drain nodes (an output pair of the differential pair) of an Nch differential transistor pair (111, 112) are coupled to the first and second nodes N1, N2, respectively.

The second current mirror 40 has an Nch transistor pair (142, 141) whose sources are coupled in common to the second power supply terminal E2 for giving the low-level power supply voltage and whose drains are coupled to the third node N3 and the fourth node N4, respectively. Gates of the Nch transistor pair (142, 141) are coupled in common, and the commonly coupled gates are coupled to the fourth node N4 that is a drain node of the Nch transistor 141. Nodes of the node pair (N3, N4) serve as an output and an input of the Nch current mirror 40, respectively.

The first floating current source circuit 50 has a floating current source 150 coupled between the node N2 that is an input node of the first current mirror 30 and the node N4 that is an input node of the second current mirror 40.

The second floating current source circuit 60 has a Pch transistor 161 and an Nch transistor 162 that are coupled in parallel between the node N1 that is an output node of the first current mirror 30 and the node N3 that is an output node of the second current mirror 40. Bias voltages BP2 and BN2 are supplied to a gate of the Pch transistor 161 and a gate of the Nch transistor 162, respectively.

The first floating current source circuit 50 may be comprised of a floating current source that includes a Pch transistor and an Nch transistor that are coupled in parallel, for example, like the second floating current source circuit 60. Alternatively, it may be comprised of a floating current source that includes an Nch transistor and a Pch transistor to each of whose gates a bias voltage is supplied and that are coupled in series between input nodes (the nodes N2, N4) of current mirrors 30, 40. In the latter configuration, currents between the input nodes (the nodes N2, N4) of the current mirrors 30, 40 are controlled to be almost constant currents.

The output amplification stage 20 has a Pch transistor 121 that is coupled between the third power supply terminal E3 for giving the high-level power supply voltage for output and whose gate is coupled to the node N1 of the differential input stage, and an Nch transistor 122 that is coupled between the fourth power supply terminal E4 for giving the low-level power supply voltage for output and whose gate is coupled to the node N3 of the differential input stage. Incidentally, a configuration in which E1 and E2 are coupled to a common power supply VDD, and E2 and E4 are coupled to a common power supply VSS, etc. may be adopted.

The amplification boost circuit 70 has: an Nch transistor pair (171, 172) whose sources are coupled in common and whose gates are coupled to the input terminal 1 to which the input voltage VI is supplied and the output terminal 2 from which the output voltage VO is outputted and that form an Nch differential pair; the current source 173 whose one end is coupled to a seventh power supply terminal E7 for giving the low-level power supply voltage and whose other end is coupled to the commonly coupled sources of the Nch transistor pair (171, 172); the current sources 174 and 175 that are coupled between the output pair of an Nch differential transistor pair (171, 172) and the fifth power supply terminal E5 for giving the high-level power supply voltage and serves as a load element pair; the current source 176 and a Pch transistor 177 coupled in series between the fifth power supply terminal E5 and the node N4 of the differential input stage 10; and the current source 178 and a Pch transistor 179 coupled in series between the fifth power supply terminal E5 and the node N1 of the differential input stage 10. Incidentally, a configuration in which E5 is coupled to the common power supply VDD to E1, and E7 is coupled to the common power supply VSS may be adopted. The power supply will be described later (refer to <Supply voltage of power supply terminal>).

A gate of the Pch transistor 177 is coupled with the coupling point 3 of one output of an output pair of the Nch transistor pair (171, 172) (the drain of the Nch transistor 171) and the current source 174.

A gate of the Pch transistor 179 is coupled with the coupling point 4 of the other output of the output pair of the Nch transistor pair (171, 172) (a drain of the Nch transistor 172) and the current source 175.

Incidentally, in FIG. 1, a configuration in which a source of the Pch transistor 177 is coupled to the fifth power supply terminal E5 and the current source 176 is coupled between the drain of the Pch transistor 177 and the node N4 may be adopted. A configuration in which a source of the Pch transistor 179 is coupled to the fifth power supply terminal E5 and the current source 178 is coupled between a drain of the Pch transistor 179 and the node N1 may be adopted. The embodiments that will be explained later are also the same.

Alternatively, a configuration in which the Pch transistors 177, 179 are deleted and current sources 176, 178 are controlled to be activated or deactivated (a current is outputted at the time of activation and current output is stopped at the time of deactivation) based on respective potentials of nodes 3, 4 after inputting the potentials of the nodes 3, 4 as control signals may also be adopted.

The load element pair is not limited to the current sources, and only needs to be an element capable of varying the potentials of the nodes 3, 4 according to currents of differential outputs of the Nch differential transistor pair (171, 172) and of switching activation and deactivation of the respective current sources 176, 178. Specifically, a configuration in which the current sources 174, 175 that serve as the load element pair are replaced with resistance elements (pair) or diodes (pair) may be adopted.

In FIG. 1, the amplification boost circuit 70 operates when the input voltage VI of the input terminal 1 varies to a potential whose potential difference relative to the output voltage VO of the output terminal 2 exceeds a predetermined potential difference, and acts so that a differential amplification operation of the differential input stage 10 and the output amplification stage 20 may be boosted. The amplification boost circuit 70 combines a current I7 (source current) of the current source 176 with an input-side current (a drain current of the Nch transistor 141) of the second current mirror 40 of the differential input stage 10 from the node N4 to increase the current value, and thereby boosts the potential drop of the nodes N1, N3, so that a charging operation of the output terminal 2 by the output amplification stage 20 is boosted.

Moreover, the amplification boost circuit 70 combines the current I8 (source current) of the current source 178 with the current (a drain current of the Pch transistor 132) on the output side of the first current mirror 30 of the differential input stage 10 from the node N1 to increase the current value, and thereby boosts the potential rise of the nodes N1, N3, so that it boosts a discharging operation of the output terminal 2 by the output amplification stage 20.

Operations of the output circuit 100A shown in FIG. 1 will be explained below. Incidentally, currents of the current sources 113, 173, 174, 175, 176, and 178 in a stable output state is denoted by I1, I4, I5, I6, I7, and I8, respectively, and a current of the floating current source 150 is denoted by I2, and a total current of currents of the floating current sources 161, 162 is denoted by I3 (=I2). Moreover, the input voltage VI shall be a step voltage.

First, regarding the output circuits (output circuits in the state where a control of the amplification boost circuit 70 is not received) other than the amplification boost circuit 70, their operations will be explained, and after that, operations when the control of the amplification boost circuit 70 is received will be explained.

When the input voltage VI of the input terminal 1 varies toward the power supply terminal E1 (high voltage) side with respect to the output voltage VO of the output terminal 2, gate-source voltages of the Nch differential transistor pair (111, 112) of the differential input stage 10 expand and reduce, respectively, and as compared with time of the stable output state (namely, at the time of equilibrium with output voltage VO=input voltage VI), and drain currents of the transistors 111, 112 increase and decrease, respectively.

Reduction of a drain current of a transistor 112 of the Nch differential transistor pair (111, 112) causes a drain current of the Pch transistor 131 that is in a diode connection to decrease, and accordingly, a gate-source voltage (absolute value) of the Pch transistor 131 reduces. This decreases a drain current (absolute value) of the Pch transistor 132 whose gate is coupled in common with the gate of the Pch transistor 131. A drain current of the transistor 111 of the Nch differential transistor pair (111, 112) increases. Consequently, a potential of the node N1 falls.

That is, when the drain current of the Pch transistor 132 decreases and the drain current of the Nch transistor 111 increases, a voltage of the node N1 falls.

Because of a potential drop of the node N1, in the Pch transistor 161 (gate voltage=voltage BP2) of the second floating current source circuit 60, its gate-source voltage (absolute value) reduces, and a drain current (absolute value) of the Pch transistor 161 decreases.

On the other hand, the output current (a drain current of the Nch transistor 142) of the Nch current mirror 40 is equivalent to a current obtained by folding back a current I2 flowing in a first floating current source 50, and is maintained in an almost comparable manner to the stable output state. As a result, a potential of the node N3 falls.

That is, regarding the nodes N1, N3 coupled to each other through the second floating current source circuit 60 (comprised of an Nch transistor 161 and a Pch transistor 162), in response to the potential drop of the node N1, the potential of the node N3 also falls in conjunction therewith. Incidentally, amounts of potential variation of the nodes are different.

Because of the potential drop of the nodes N1, N3, the charging current from the power supply terminal E3 in the Pch transistor 121 of the output amplification stage 20 to the output terminal 2 increases and the discharging current from the output terminal 2 in the Nch transistor 122 to the power supply terminal E4 decreases. This raises the output voltage VO of the output terminal 2. Then, when the output voltage VO approaches near the input voltage VI, a difference of current values of the Nch differential transistor pair (111, 112) becomes small, and node potentials of the Pch current mirror and the second floating current source circuit 60 (161, 162) and currents of the transistors recover to equilibrium states. Finally, when the output voltage VO has reached the input voltage VI, they have become in their stable output states.

On the other hand, when the input voltage VI of the input terminal 1 varies largely toward the power supply voltage side of the power supply terminal E2 or E6 (low voltage) with respect to the output voltage VO of the output terminal 2, the gate-source voltages of the Nch transistor pair (111, 112) of the differential input stage 10 reduce and expand, respectively, and the drain currents of the transistors 111, 112 reduce and increase, respectively, as compared with time of the stable output state.

By an increase of a drain current of the transistor 112 of the Nch differential transistor pair (111, 112), the drain current of the Pch transistor 131 that is in a diode connection also increases, and the gate-source voltage (absolute value) of the Pch transistor 131 expands corresponding to it. Consequently, the drain current (absolute value) of the Pch transistor 132 whose gate is coupled to the gate of the Pch transistor 131 in common also increases. Since the drain current of the transistor 111 of the Nch differential transistor pair (111, 112) decreases, the potential of the node N1 rises.

By the potential rise of the node N1, a gate-source voltage (absolute value) of the Pch transistor 161 of the second floating current source circuit 60 expands, and the drain current (absolute value) of the Pch transistor 161 increases. On the other hand, the output current (the drain current of the Nch transistor 142) of the Nch current mirror 40 is a current obtained by folding over the current I2 of the first floating current source 50, and is maintained at almost the same level as the stable output state. As a result, the potential of the node N3 rises.

That is, regarding the nodes N1, N3 coupled through the second floating current source circuit 60, the potential of the node N3 also rises in response to the potential rise of the node N1 in a conjunction therewith. Incidentally, the amount of potential variation of the each node is different from the other.

As a result, by the potential rises of the nodes N1, N3, the charging current from the power supply terminal E3 in the Pch transistor 121 of the output amplification stage 20 to the output terminal 2 decreases and the discharging current from the output terminal 2 in the Nch transistor 122 to the power supply terminal E4 increases. This lowers the output voltage VO of the output terminal 2. Then, when the output voltage VO approaches near the input voltage VI, a difference of the current values of the Nch differential transistor pair (111, 112) becomes small, and node potentials of the Pch current mirror 30 and the second floating current source circuit 60 and currents of the transistors recover to respective equilibrium states. Finally, when the output voltage VO has reached the input voltage VI, they have become in their stable output states.

Next, operations of the amplification boost circuit 70 will be explained. Operations of the amplification boost circuit 70 serves as additional actions to a usual differential amplification operation that is free from any control of the amplification boost circuit 70.

Currents I5, I6 of the respective current sources 174, 175 of the amplification boost circuit 70 are set to become larger than respective drain currents of the Nch differential transistor pair (171, 172) of the amplification boost circuit in the stable output state (namely, at the time of an equilibrium of output voltage VO=input voltage VI). Therefore, both of a coupling node 3 of the drain of the Nch transistor 171 and the current source 174 and a coupling node of the drain of the Nch transistor. 172 and the current source 175 are set to a power supply voltage of the fifth power supply terminal E5 in the stable output state, both of the Pch transistors 177 and 179 are turned off, and the current sources 176, 178 are reduced to the inactive (current stop) states. To be specific, denoting the drain currents of the Nch differential transistor pair (171, 172) in the stable output state by Is71 and Is72 (however, Is71+Is72=I4), respectively, the current I5 is set to a current value that is larger than the current Is71 by ΔI71 (>0): I5=Is71+ΔI71, and the current I6 is set to a current value that is larger than the current Is72 by ΔI72 (>0): I6=Is72ΔI72.

When the input voltage VI varies toward the power supply terminal E1 or E5 (high voltage) side with respect to the output voltage VO, gate-source voltages of the transistors 171, 172 of the Nch differential pair of the amplification boost circuit 70 expand and reduce, respectively, and the drain currents of the Nch differential transistor pair (171, 172) increase and decrease, respectively, as compared with time of the stable output state. If a potential difference between the input voltage VI and the output voltage VO is a first value Vt1 when the drain current of the Nch transistor 171 becomes the same current value as the current I5 of the current source 174, when the voltage difference of the input voltage VI relative to the output voltage VO exceeds the first value Vt1, the potential of the node 3 falls lower than the voltage of the fifth power supply terminal E5, and the Pch transistor 177 turns on. That is, when a voltage difference between the output voltage VO and the voltage of the fifth power supply terminal E5 exceeds the first value Vt1 as compared with a voltage difference between the input voltage VI and the voltage of the fifth power supply terminal E5 (VI−VO>Vt1>0), the Pch transistor 177 turns on.

This activates the current source 176, and supplies the current I7 of the current source 176 to an input port (the node N4) of the Nch current mirror 40.

At this time, the potential of the node 4 is maintained at the voltage of the fifth power supply terminal, and the Pch transistor 179 remains off, and the current source 178 is made inactive.

In the output circuit 100A, when the input voltage VI varies toward the power supply terminal E1 (high voltage) side with respect to the output voltage VO as explained above in the usual differential amplification operation by the differential input stage 10 and the output amplification stage 20, the potentials of the nodes N1, N3 are reduced and a charging action of the output terminal 2 by the output amplification stage 20 arises. At this time, if the current I7 from the current source 176 of the amplification boost circuit is supplied to the node N4, the input current and the output current of the Nch current mirror 40 (drain currents of the Nch transistors 141, 142) will increase. This boosts the potential drop of the node N3. Furthermore, the current (discharging current) that flows in floating current source circuits 161, 162 through the node N3 increases, the potential drop of the node N1 is also boosted, and the charging action of the output terminal 2 by the output amplification stage 20 is boosted.

Incidentally, when the output voltage VO approaches the input voltage VI and the voltage difference between the input voltage VI and the output voltage VO falls below the first value Vt1 (VI−VO<Vt1), the potential of the node 3 of the amplification boost circuit 70 varies to the voltage of the fifth power supply terminal E5, and the Pch transistor 177 turns off. This deactivates the current source 176, stops supply of the current I7 of the amplification boost circuit 70, and also stops an amplification boosting action.

After this, the output circuit 100A shifts to the usual differential amplification operation by the differential input stage 10 and the output amplification stage 20 that is free from the control of the amplification boost circuit 70, in which the charging operation of the output terminal 2 is performed, and when the output voltage VO has reached the input voltage VI, the output circuit 100A has become in its stable output state.

On the other hand, when the input voltage VI changes largely toward the power supply terminal E2 or E7 (low voltage) side with respect to the output voltage VO, the gate-source voltages of the Nch differential transistor pair (171, 172) of the amplification boost circuit 70 reduce and expand, respectively, and the drain currents of the Nch differential transistor pair (171, 172) decrease and increase, respectively, as compared with time of the stable output state. If the potential difference between the input voltage VI and the output voltage VO is a second value Vt2 when a drain current of the transistor 172 becomes the same current value as the current I6 of the current source 175, when the voltage difference of the input voltage VI relative to the output voltage VO exceeds the second value Vt2, the potential of the node 4 falls lower than the voltage of the fifth power supply terminal, and the Pch transistor 179 turns on. That is, when the voltage difference between the input voltage VI and the voltage of the fifth power supply terminal E5 exceeds the second value Vt2 as compared with the voltage difference between the output voltage VO and the voltage of the fifth power supply terminal E5 (|VI−VO|>|Vt2|>0, the Pch transistor 179 turns on.

This activates the current source 178, and the current source 178 supplies the current I8 to the output terminal (the node N1) of the Pch current mirror 30. At this time, the potential of the node 3 is maintained at the voltage of the fifth power supply terminal E5, and the current source 176 is made inactive with the Pch transistor 177 being kept off.

In the output circuit 100A of FIG. 1, at the time of the usual differential amplification operation by the differential input stage 10 and the output amplification stage 20, if the input voltage VI changes to a power supply terminal E2 or E7 (low voltage) side with respect to the output voltage VO, as explained above, the potentials of the nodes N1, N3 will be raised and a discharging action of the output terminal 2 by the output amplification stage 20 will arise. At this time, if the current I8 from the current source 178 of the amplification boost circuit 70 is supplied to the node N1, the potential rise of the node N1 will be boosted. Furthermore, a current (charging current) flowing in the second floating current source circuit 60 (161, 162) increases through the node NI, the potential rise of the node N3 is also boosted, and the discharging action of the output terminal 2 by the output amplification stage 20 is boosted.

Incidentally, when the output voltage VO approaches the input voltage VI, and the voltage difference between the input voltage VI and the output voltage VO falls below the second value Vt2 (|VI−VO|<|Vt2|), the potential of the node 4 of the amplification boost circuit 70 varies to the voltage of the fifth power supply terminal E5, and the Pch transistor 179 turns off.

By this, the current source 178 becomes inactive, supply of the current I8 of the amplification boost circuit 70 is stopped, and the amplification boosting action is also stopped. After this, the output circuit 100A shifts to the usual differential amplification operation by the differential input stage 10 and the output amplification stage 20 that is free from the control of the amplification boost circuit 70, the discharging operation of the output terminal 2 is performed, and when the output voltage VO has reached the input voltage VI, the output circuit 100A has become in its stable output state.

The voltage differences between the input voltage VI and the output voltage VO at which the amplification boost circuit 70 is switched between the operation and the stop (the first value Vt1, the second value Vt2) are governed by currents I4, I5, and I6 (namely, ΔI71, ΔI72) of the current sources 173, 174, and 175 and a setting of a transistor characteristic of the Nch differential transistor pair (171, 172).

By what was described above, the amplification boost circuit 70 performs an amplification boosting operation and boosts the charging operation or the discharging operation of the output terminal 2 in the following cases: when the input voltage VI varies and the voltage difference between the input voltage VI and the output voltage VO becomes larger than the first value Vt1 at the time of the charging operation of the output terminal 2; and when the input voltage VI varies and the voltage difference becomes larger than the second value Vt2 at the time of the discharging operation of the output terminal 2.

Then, when the output voltage VO approaches the input voltage VI, and the voltage difference between the input voltage VI and the output voltage VO becomes less than the first value Vt1 or the second value Vt2, the amplification boost circuit 70 stops its operation automatically.

When a variation of the input voltage VI is small and the voltage difference between the input voltage VI and the output voltage VO is less than or equal to the first value Vt1 or the second value Vt2, the amplification boost circuit 70 does not operate. Incidentally, the transistors 171, 172 of the Nch differential pair of the amplification boost circuit 70 may be made sufficiently small-sized, and it is desirable that a gate parasitic capacitance of the transistor 171 coupled to the input terminal 1 be suppressed to be small and an increase of the input capacitance of the output circuit 100A of FIG. 1 be suppressed to be minimum.

<Symmetry of Output Voltage Waveforms and Area at the Time of Charging and at the Time of Discharging>

Next, an output voltage waveform in this embodiment will be explained.

The charging boost operation or discharging boost operation of the output terminal 2 by the amplification boost circuit 70 is dependent on current values of the currents I7, I8 of the current sources 176, 178 of the amplification boost circuit 70. Therefore, even when there is a difference between the charging speed and the discharging speed of the output terminal 2 in the usual differential amplification operation of the differential amplification stage 10 and the output amplification stage 20, by adjusting the currents I7, I8 of the current sources 176, 178 of the amplification boost circuit 70, it is possible to nearly equate the charging speed and the discharging speed, and to easily realize symmetry of the output voltage waveforms at the time of charging and at the time of discharging.

For example, it is normally hard for the differential amplifier that has the differential input stage 10 and the output amplification stage 20 that are comprised of transistors of a single conductivity type as shown in FIG. 1 (in the case of not having the amplification boost circuit 70) to secure the symmetry of the output waveforms at the time of charging and at the time of discharging. By adding the amplification boost circuit 70, the symmetry of the output voltage waveforms at the time of charging and at the time of discharging can be easily realized.

Moreover, as shown in FIG. 1, according to this embodiment, since each differential pair of the differential input stage 10 and the amplification boost circuit 70 can be configured with a single differential pair of a single conductivity type, the number of elements of the differential input stage can be curtailed and an increase of the area by addition of the amplification boost circuit 70 can be suppressed as compared with the configuration (FIG. 13) of a pertinent art that each of a differential amplifier 700 and an SBC 710 is comprised of two differential pairs of different conductivity types, respectively.

<Phase Compensation Capacitor>

Next, a phase compensation capacitor in this embodiment will be explained.

In the embodiment shown in FIG. 1, in order to secure output stability in a feedback coupling configuration, the phase compensation capacitor may be provided. In FIG. 1, the phase compensation capacitor can be provided between the output terminal 2 and one of gates (the node N1 or N3) of the transistors 121, 122 of the output amplification stage 20 or two of the phase compensation capacitors can be provided between the output terminal 2 and both the gates (the nodes N1, N3) thereof.

By adjusting the currents I7, I8 of the current sources 176, 178 of the amplification boost circuit 70 according to coupling of the phase compensation capacitor, it is possible to realize fast charging and discharging of the phase compensation capacitor and to realize the symmetry of the output voltage waveforms at the time of charging and at the time of discharging.

<Drive Speed, Power Consumption>

Next, drive speed and power consumption in this embodiment will be explained.

In the embodiment of FIG. 1, the charging speed and the discharging speed of the output terminal 2 are controllable by setting the current values of the currents I7, I8 of the current sources 176, 178 of the amplification boost circuit 70. Consequently, it is possible to suppress static consumed power by setting currents other than the currents I7, I8 of the current sources 176, 178 small and by making small an idling current of the output circuit 100A in a stable output state. Consequently, the output circuit 100A of FIG. 1 can realize low power consumption and high-speed driving.

<Supply Voltage of Power Supply Terminal>

Figure 11B:
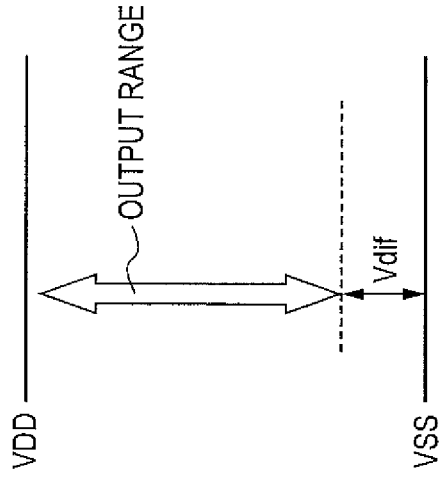
FIG. 11B is a diagram for explaining an output range of an OLED display driver.

Next, a setting of supply voltages of the power supply terminals in this embodiment will be explained. For example, in the case where the configuration of FIG. 1 is used as an output circuit for driving an output range of the OLED driver of FIG. 11B, all the supply voltages of the first, third, and fifth power supply terminals E1, E3, and E5 can be set to the high-level power supply voltage VDD, and all the supply voltages of the second, fourth, sixth, and seventh power supply terminals E2, E4, E6, and E7 can be set to the low-level power supply voltage VSS.

Figure 11A:
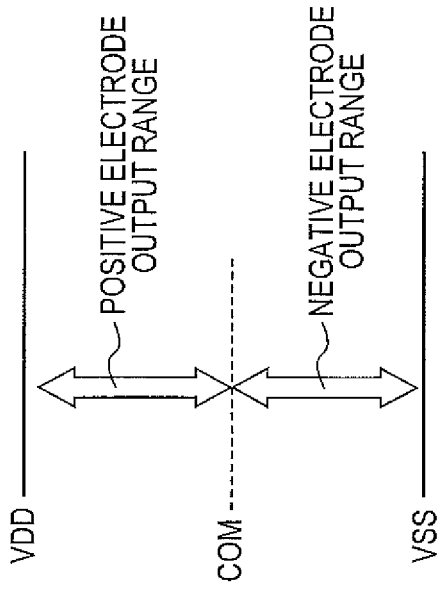
FIG. 11A is a diagram for explaining an output range of an LCD driver.

On the other hand, in the case where the output circuit 100A of FIG. 1 is used as an output circuit for driving positive electrode and negative electrode output ranges of the LCD driver of FIG. 11A, like the output circuit for OLED driver, all the supply voltages of the first, third, and fifth power supply terminals E1, E3, and E5 can be set to the high-level power supply voltage VDD, and all the supply voltages of the second, fourth, sixth, and seventh power supply terminals E2, E4, E6, and E7 can be set to the low-level power supply voltage VSS.

Moreover, there is also a case where a medium-level power supply voltage VML corresponding to a lower limit of the positive electrode output range near the common voltage of an opposing substrate electrode 974 (FIG. 12A) and a medium-level power supply voltage VMH corresponding to an upper limit of the negative electrode output range are further supplied. At this time, in the case of the output circuit for driving the positive electrode output range, the following setting may be taken: all the power supply voltages of the first, third, and fifth power supply terminals E1, E3, and E5 are set to the high-level power supply voltage VDD, the power supply voltage of the fourth power supply terminal E4 is set to the medium-level power supply voltage VML, all the power supply voltages of the sixth and seventh power supply terminals E6, E7 are set to the low-level power supply voltage VSS, and the power supply voltage of the second power supply terminal E2 is set to the low-level power supply voltage VSS or the medium-level power supply voltage VML. Especially, by making small a power supply voltage difference between the third and fourth power supply terminals E3, E4 of the output amplification stage 20 where a flowing current is large by setting the power supply voltage of the fourth power supply terminal E4 to the medium-level power supply voltage VML, the power consumption depending on (current×voltage) is reduced, which also gives a heat generation depression effect.

Incidentally, regarding the power supply voltages of the sixth and seventh power supply terminals E6, E7 coupled to the current sources 113, 173 for driving respective Nch differential pairs of the differential input stage 10 and the amplification boost circuit 70, the lower limits of the operating ranges of respective Nch differential pairs become voltages higher than the power supply voltages of the sixth and seventh power supply terminals E6, E7 by respective threshold voltages of the Nch differential transistor pairs (111, 112), (171, 172), respectively.

Even when the threshold voltage of the Nch differential transistor pair is large to some extent, if the sixth and seventh power supply terminals E6, E7 are set to the low-level power supply voltage VSS, there will be no harm in using the output circuit 100A of FIG. 1 as an output circuit for driving the positive electrode output range (VML to VDD) of an LCD driver of FIG. 11A.

Incidentally, since when the threshold voltages of the Nch differential transistor pairs (111, 112), (171, 172) are almost near zero, a lower limit of the operational range of the Nch differential pair becomes near the power supply voltage of the sixth and seventh power supply terminals E6, E7, it is also possible to set all the power supply voltages of the first, third, and fifth power supply terminals E1, E3, and E5 to the medium-level power supply voltage VMH, to set all the power supply voltages of the second, fourth, sixth, and seventh power supply terminals E2, E4, E6, and E7 to the low-level power supply voltage VSS, and to use the output circuit 100A of FIG. 1 as an output circuit for driving the negative electrode output range (VSS to VMH) of the LCD driver of FIG. 11A.

<Comparison of this Embodiment and Pertinent Art>

Below, the amplification boost circuit 70 of this embodiment of FIG. 1 and the slew rate boost circuit (SBC) 710 of the pertinent art shown in FIG. 13 will be compared and explained.

Figure 13:
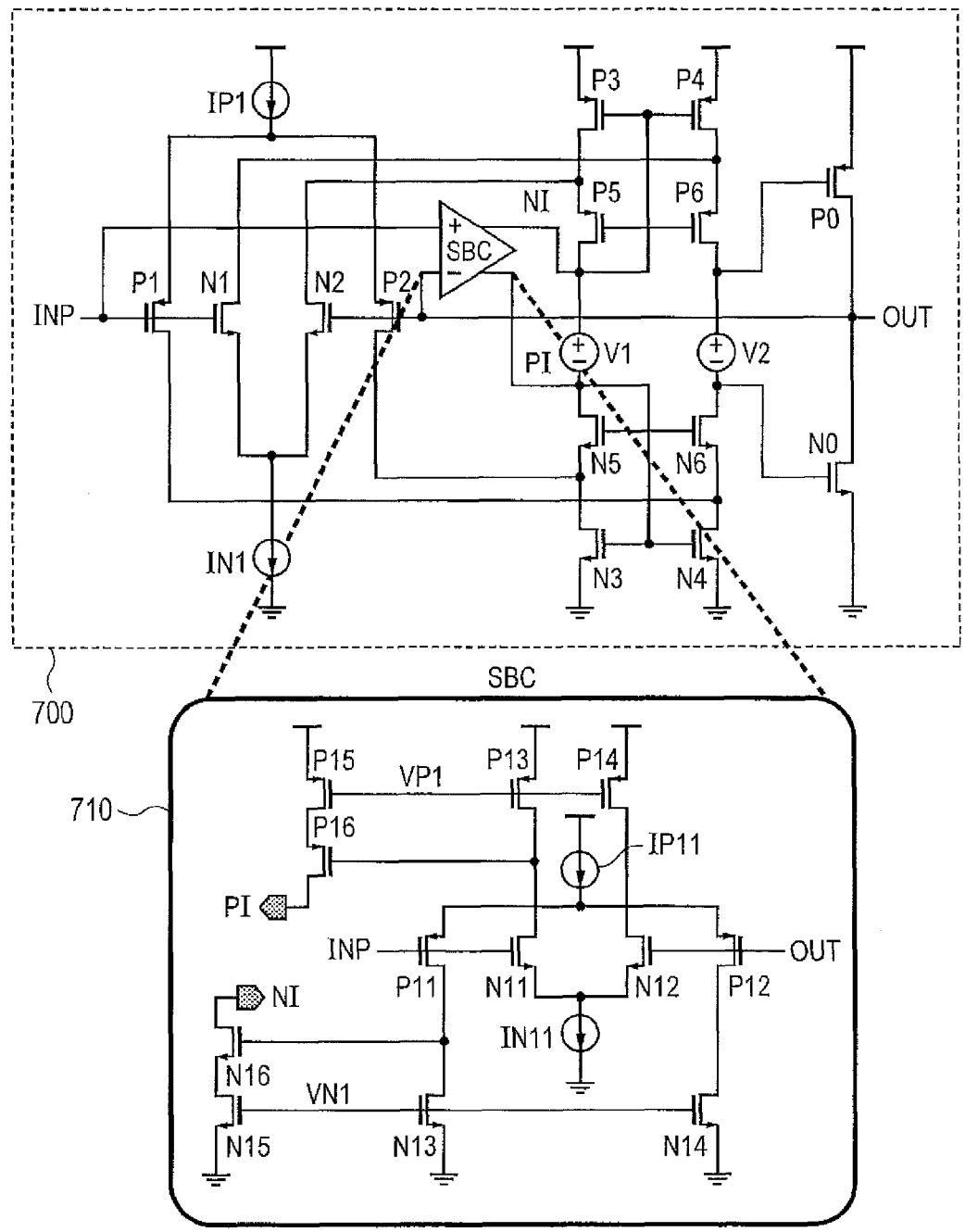
FIG. 13 is a drawing that quotes FIG. 3 of 6.6L: Late-News Paper: A Low Quiescent Current and Fast Settling Output Buffer with Boosting Slew-rate Scheme for Large LCD driver, II Kwon Chang et al., SID 10 DIGEST, pp. 74-76, 2010.

The slew rate boost circuit (SBC) 710 of FIG. 13 has two differential pairs of the Nch differential pair (N11, N12) and the Pch differential pair (P11, P12), the charging boost operation of the output terminal is performed by an operation of the Nch differential pair (N11, N12), and the discharging boost operation of the output terminal is performed by an operation of the Pch differential pair (P11, P12). Moreover, corresponding to the two differential pairs, they have two sets of current sources for driving respective differential pairs and two sets of load element pairs, respectively.

In this embodiment, the charging boost operation and the discharging boost operation of the output terminal are realizable only by one differential pair (171, 172) in the amplification boost circuit 70 of FIG. 1.

Moreover, coupling nodes of the currents I7, I8 supplied to the differential amplifier stage from the amplification boost circuit 70 are different from those of the slew rate boost circuit (SBC) of FIG. 13.

Furthermore, since the amplification boost circuit 70 can be comprised of the single differential pair (171, 172), the single current source 173, and the single load element pair (174, 175), the number of elements is small, and its area can be reduced.

Still furthermore, since the number of the current source 173 is only one, the idling current of the amplification boost circuit 70 in the stable output state can also be suppressed small.

Second Embodiment

Figure 2:
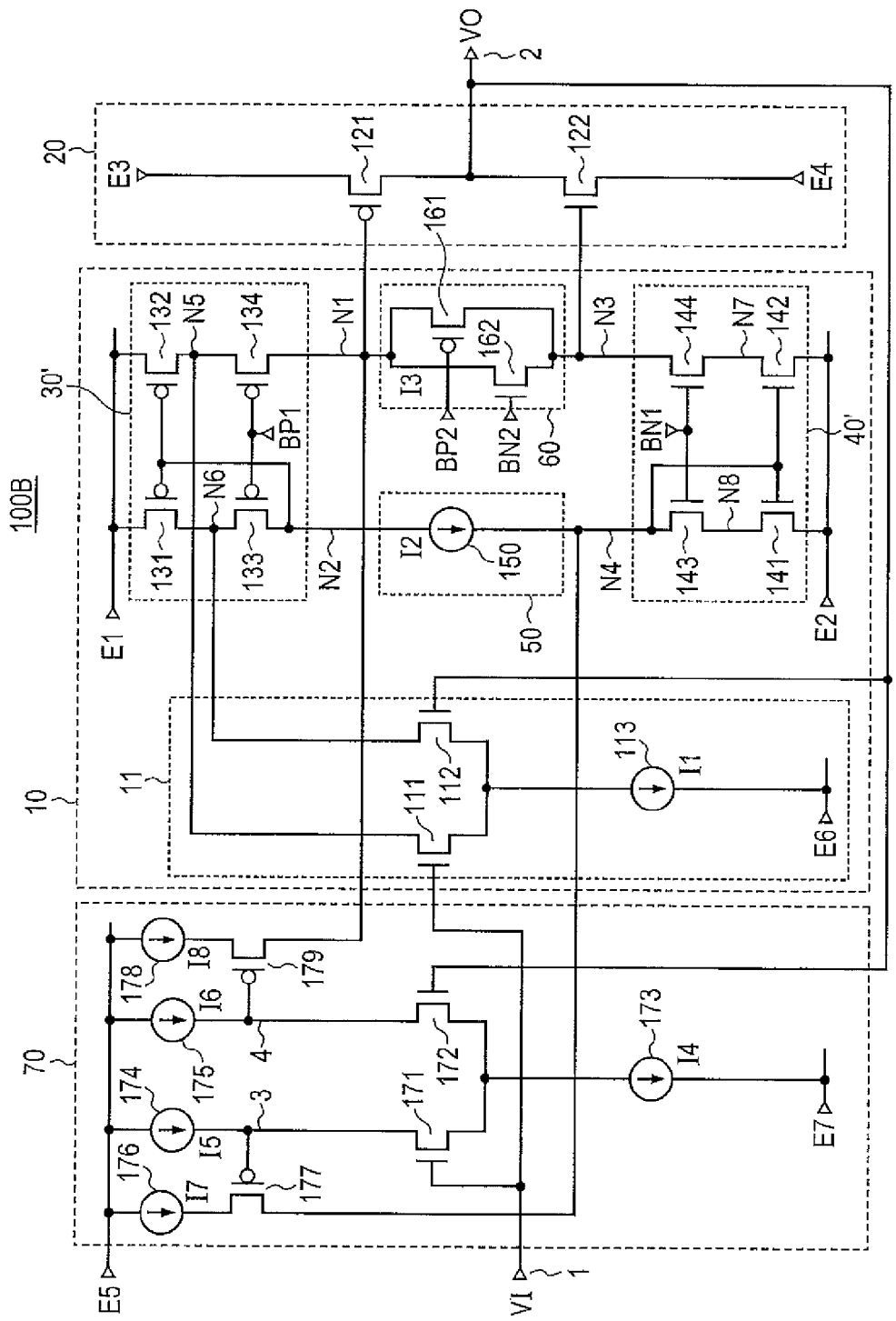
FIG. 2 is a diagram showing a configuration of a second embodiment of the present invention.

Next, a second embodiment of the present invention will be explained. FIG. 2 is a diagram showing a configuration of an output circuit 100B of the second embodiment of the present invention. The output circuit 100B of FIG. 2 is the output circuit 100A of FIG. 1 whose current mirrors 30, 40 of FIG. 1 are changed to low-voltage cascade current mirrors 30', 40'. Similarly with FIG. 1, the output circuit of FIG. 2 has the differential input stage 10 for receiving the input voltage VI and the output voltage VO in a differential mode, the output amplification stage 20 that receives the first and second outputs (the nodes N1, N3) of the differential input stage 10, and outputs the output voltage VO according to the input voltage VI from the output terminal 2 by performing a push-pull operation, and the amplification boost circuit 70 that detects the potential difference between the input voltage VI and the output voltage VO and boosts the amplifying action of the output amplification stage 20 according to the voltage difference. Other configurations than the configuration of the current mirrors 30', 40' are the same as those of FIG. 1.

The differential input stage 10 has the first differential stage 11, the Pch current mirror 30', the Nch current mirror 40', the first and second floating current source circuits 50, 60. Below, configurations of the current mirrors 30', 40' will be explained, and explanations of configurations of the first differential stage 11, the first and second floating current source circuits 50, 60, and the amplification boost circuit 70 are omitted.

The Pch current mirror 30' is comprised of the low-voltage cascode current mirror coupled between the first power supply terminal E1 and a node pair (N1, N2). More specifically, the Pch current mirror 30' has a first-stage Pch transistor pair (132, 131) whose gates are coupled in common and whose sources are coupled to the power supply terminal E1 in common, and a second-stage Pch transistor pair (134, 133) whose gates are coupled in common to receive a bias voltage BP1, whose sources are coupled to drains of the first-stage Pch transistor pair (132, 131), respectively, and whose drains are coupled to the node pair (N1, N2), respectively. The commonly coupled gates of the first-stage Pch transistor pair (132, 131) are coupled to the node N2. The node pair (N1, N2) is designated to be an output node and an input node of the Pch current mirror 30', respectively.

Output pair (drains of the transistors 111, 112) of the Nch differential transistor pair (111, 112) of the first differential stage 11 is coupled to a coupling point (a node N5) of the Pch transistors 132, 134 and a coupling point (a node N6) of the Pch transistors 131, 133, respectively.

The Nch current mirror 40' is comprised of the low-voltage cascade current mirror coupled between the power supply terminal E2 and a node pair (N2, N4). More specifically, the Nch current mirror 40' has the first-stage Nch transistor pair (142, 141) whose gates are coupled in common and whose sources are coupled in common to the power supply terminal E2, and a second-stage Nch transistor pair (144, 143) whose gates are coupled in common to receive a bias voltage BN1, whose sources are coupled to drains of the first-stage Nch transistor pair (142, 141), respectively, and whose drains are coupled to the node pair (N3, N4). The commonly coupled gate of the first-stage Nch transistor pair (142, 141) is coupled to the node N4. The node pair (N3, N4) is designated to be an output node and an input node of the Nch current mirror 40', respectively.

The current source 176 of the amplification boost circuit is coupled to an input port (the node N4) of the Nch current mirror 40' through the transistor 177, and the current source 178 thereof is coupled to an output port (the node N1) of the Pch current mirror 30' through the transistor 179.

Operations of the output circuit shown in FIG. 2 will be explained below. First, an operation of the output circuit other than the amplification boost circuit 70 will be explained.

When the input voltage VI of the input terminal 1 varies toward the power supply terminal E1 (high voltage) side with respect to the output voltage VO of the output terminal 2, in the Nch differential transistor pair (111, 112), the gate-source voltages expand and reduce, respectively, and the drain currents of the transistors 111, 112 increase and decrease, respectively, as compared with time of the stable output state.

By decreases of the drain currents of the transistor 112 of the Nch transistor pair (111, 112), a drain current (absolute value) of the Pch transistor 131 decreases. Although, for this reason, an action of making small the drain-source voltage of the Pch transistor 131 (an absolute value of a differential voltage between the node N6 and the first power supply terminal E1) is produced, a gate-source voltage of the Pch transistor 133 (an absolute value of the differential voltage between the voltage BP1 and the node N6) increases. Consequently, the charging action of a drain (the node N2) of the Pch transistor 133 is produced. As a result, the potential of the drain (the node N2) of the Pch transistor 133 rises corresponding to the reduction of the drain current (absolute value) of the Pch transistor 131. Alternatively, reduction of the drain current (absolute value) of the Pch transistor 131 corresponds to the reduction of the gate-source voltage (absolute value) of the Pch transistor 131, and this makes the potential of the node N2 rise.

On the other hand, the drain current (absolute value) of the Pch transistor 132 whose gate is coupled in common to the node N2 together with the Pch transistor 131 also decreases. Moreover, since the drain current of the transistor 111 of the Nch differential transistor pair (111, 112) increases, the potential of a coupling point (the node N5) of the Pch transistors 132, 134 falls. This reduces a gate-source voltage (absolute value) of the Pch transistor 134, and decreases the drain current (absolute value) of the Pch transistor 134 supplied to the node N1. Consequently, the potential of the node N1 falls.

Similarly with the explanation of the first embodiment of FIG. 1, in the nodes N1, N3 coupled through the second floating current source circuit 60 (161, 162), in response to potential variation of one node, the potential of the other node varies in the same direction (to a high-level side or low-level side) in conjunction therewith. Therefore, the potential of the node N3 also falls in conjunction with the potential drop of the node N1.

By the potential drops of the nodes N1, N3, the charging current from the power supply terminal E3 in the Pch transistor 121 of the output amplification stage 20 to the output terminal 2 increases and the discharging current from the output terminal 2 in the Nch transistor 122 to the power supply terminal E4 decreases. This raises the output voltage VO of the output terminal 2.

Then, when the output voltage VO approaches near the input voltage VI, the difference of the current values of the Nch differential transistor pair (111, 112) becomes small, and node potentials of the Pch current mirror 30' and the second floating current source circuit 60 (161, 162) and currents of the transistors recover to respective equilibrium states. When the output voltage VO has reached the input voltage VI, the output circuit has become in its stable output state.

On the other hand, when the input voltage VI of the input terminal 1 varies toward the power supply terminal E2 or E6 (low voltage) side with respect to the output voltage VO of the output terminal 2, in the Nch differential transistor pair (111, 112), the gate-source voltages reduce and expand, respectively, and the drain currents of the transistors 111, 112 decrease and increase, respectively, as compared with time of the stable output state.

By the increase of the drain current of the transistor 112 of the Nch differential transistor pair (111, 112), the drain current (absolute value) of the Pch transistor 131 increases. Consequently, an expansion action of the drain-source voltage (absolute value) of the Pch transistor 131 is produced, and a gate-source voltage (absolute value) of the Pch transistor 133 decreases. For this reason, a discharging action is produced in the drain (the node N2) of the Pch transistor 133. As a result, the potential of the drain (the node N2) of the Pch transistor 133 drops in response to the increase of the drain current (absolute value) of the Pch transistor 131.

On the other hand, the drain current (absolute value) of the Pch transistor 132 whose gate is coupled to the node N2 together with the Pch transistor 131 in common also increases. Moreover, since a drain current (absolute value) of the transistor 111 of the Nch differential transistor pair (111, 112) decreases, the potential of the coupling point (the node N5) of the Pch transistors 132, 134 rises. This expands a gate-source voltage (absolute value) of the Pch transistor 134, and increases the drain current (absolute value) of the Pch transistor 134 supplied to the node N1. Consequently, the potential of the node N1 rises. Moreover, the potential of the node N3 coupled to the node N1 through the second floating current source circuit 60 (161, 162) also rises in conjunction with the potential rise of the node N1.

By the potential rises of the nodes N1, N3, the charging current from the power supply terminal E3 in the Pch transistor 121 of the output amplification stage 20 to the output terminal 2 decreases, and the discharging current from the output terminal 2 in the Nch transistor 122 to the power supply terminal E4 increases. This lowers the output voltage VO of the output terminal 2. When the output voltage VO approaches near the input voltage VI, the difference of the current values of the Nch differential transistor pair (111, 112) becomes small, and node potentials of the Pch current mirror 30' and the floating current source circuit (161, 162) and currents of the transistors recover to respective equilibrium states. When the output voltage VO has reached the input voltage VI, they have become in their stable output states.

Next, an operation of the amplification boost circuit 70 will be explained briefly. The operation of the amplification boost circuit 70 serves as an action additional to the usual differential amplification operation of the differential amplification stage 10 and the output amplification stage 20.

A configuration and a detailed operation of the amplification boost circuit 70 are the same as the explanation of the first embodiment of FIG. 1. That is, when the voltage difference of the input voltage VI relative to the output voltage VO varies toward the power supply terminal E1 or E5 (high voltage) side to exceed the first value Vt1, that is, the voltage difference between the output voltage VO and the voltage of the fifth power supply terminal E5 exceeds the first value as compared with the voltage difference between the input voltage VI and the voltage of the fifth power supply terminal E5 (VI−VO>Vt1>0), the amplification boost circuit 70 supplies the current I7 of the current source 176 to the input port (the node N4) of the Nch current mirror 40'.

Since this increases input currents (drain currents of Nch transistors 141, 143) of the Nch current mirror 40' and also increases output currents (drain currents of Nch transistors 142, 144) of the Nch current mirror 40', the potential drop of the node N3 is boosted. Moreover, also at the node N1 coupled to the node N3 through the floating current source circuits 60 (161, 162), the potential drop is boosted in conjunction with the potential drop of the node N3.

As a result, a gate-source voltage (absolute value) of the Pch transistor 121 of the output amplification stage 20 further expands, a gate-source voltage of the Nch transistor 122 of the output amplification stage 20 decreases fast, and the rise of the output voltage VO of the output terminal 2 is quickened.

On the other hand, when the voltage difference of the input voltage VI relative to the output voltage VO changes toward the power supply terminal E2 or E7 (low voltage) side to exceed the second value Vt2, that is, when a voltage difference between the input voltage VI and the voltage of the fifth power supply terminal E5 exceeds the second value Vt2 as compared with the voltage difference between the output voltage VO and the voltage of the fifth power supply terminal E5 (|VI−VO|>|Vt2|>0), the amplification boost circuit 70 supplies the current I8 of the current source 178 to the output terminal (the node N1) of the Pch current mirror 30'.

This boosts the potential rise of the node N1. Moreover, also in the node N1 coupled with the node N3 through the second floating current source circuit (161, 162), its potential rise is boosted in conjunction with the potential rise of the node N1.

As a result, the gate-source voltage (absolute value) of the Pch transistor 121 of the output amplification stage 20 further decreases, the gate-source voltage of the Nch transistor 122 of the output amplification stage 20 expands promptly, and the drop of the output voltage VO of the output terminal 2 is quickened.

Incidentally, both at the time of charging and at the time of discharging of the output terminal 2, when the output voltage VO approaches the input voltage VI and the potential difference between the input voltage VI and the output voltage V0 falls less than the first value Vt1 or the second value Vt2 (VI−VO<Vt1 or |VI−VO|<|Vt2|), the Pch transistor 177 or 179 of the amplification boost circuit 70 turns off, the supply of the current I7 to the node N4 from the current source 176 or the supply of the current I8 to the node N1 from the current source 178 is stopped, and a boosting action of charging or discharging of the output terminal 2 is also stopped (the amplification boost circuit 70 stops its operation automatically).

After this, the process shifts to the usual differential amplification operation of the differential amplification stage 10 and the output amplification stage 20 that is free from the control of the amplification boost circuit 70, and when the output voltage VO has reached the input voltage VI, the output circuit 100B has become in its stable output state.

As described above, the output circuit 100B of FIG. 2 also has the same action as that of the output circuit 100A of FIG. 1. Moreover, similarly with FIG. 1, also in the differential amplifier of the differential input stage 10 and the output amplification stage 20 each of which has a differential pair that is comprised of transistors of a single conductivity type, by adjusting the currents I7, I8 of the current sources 176, 178 of the amplification boost circuit 70, it is possible to nearly equate the charging speed and the discharging speed, and the symmetry of the output voltage waveforms at the time of charging and at the time of discharging can be easily realized. Moreover, similarly with FIG. 1, since respective differential pairs of the differential input stage 10 and the amplification boost circuit 70 can be formed with transistors of a single conductivity type, the number of elements of the differential input stage 10 is reduced, and the increase of the area by the addition of the amplification boost circuit 70 can also be suppressed.

In the output circuit of FIG. 2, in order to secure the output stability in the feedback coupling configuration, the phase compensation capacitor may be provided.

In FIG. 2, the phase compensation capacitor can be provided one or both of between the coupling point (the node N5) of the Pch transistors 132, 134 and the output terminal 2 and between a coupling point (a node N7) of the Nch transistors 142, 144 and the output terminal 2, for example. Alternatively, it may be provided between one (the node N1 or N3) or both (the nodes N1 and N3) of a gate of the Nch transistor 121 and a gate of the Pch transistor 122, and the output terminal 2.

By adjusting the currents I7, I8 of the current sources 176, 178 of the amplification boost circuit 70 according to coupling of the phase compensation capacitor, it is possible to realize fast charging and discharging of the phase compensation capacitor, and to realize the symmetry of the output voltage waveforms at the time of charging and at the time of discharging.

Furthermore, even when the idling currents of the output circuit 100B (the currents I1, I2, and I3 of the differential input stage 10, currents of the Pch transistors 121, 122 of the output amplification stage 20, and the current I4 of the current source 173 of the amplification boost circuit 70) are made small to suppress the static consumed power, the output circuit 100B of FIG. 2 can perform a high-speed operation by an action of the amplification boost circuit 70, and therefore can realize low power consumption and high-speed driving. In this embodiment, the supply voltages supplied to the power supply terminals are the same as those of FIG. 1, their explanations in FIG. 1 shall be referred to.

Third Embodiment

Figure 3:
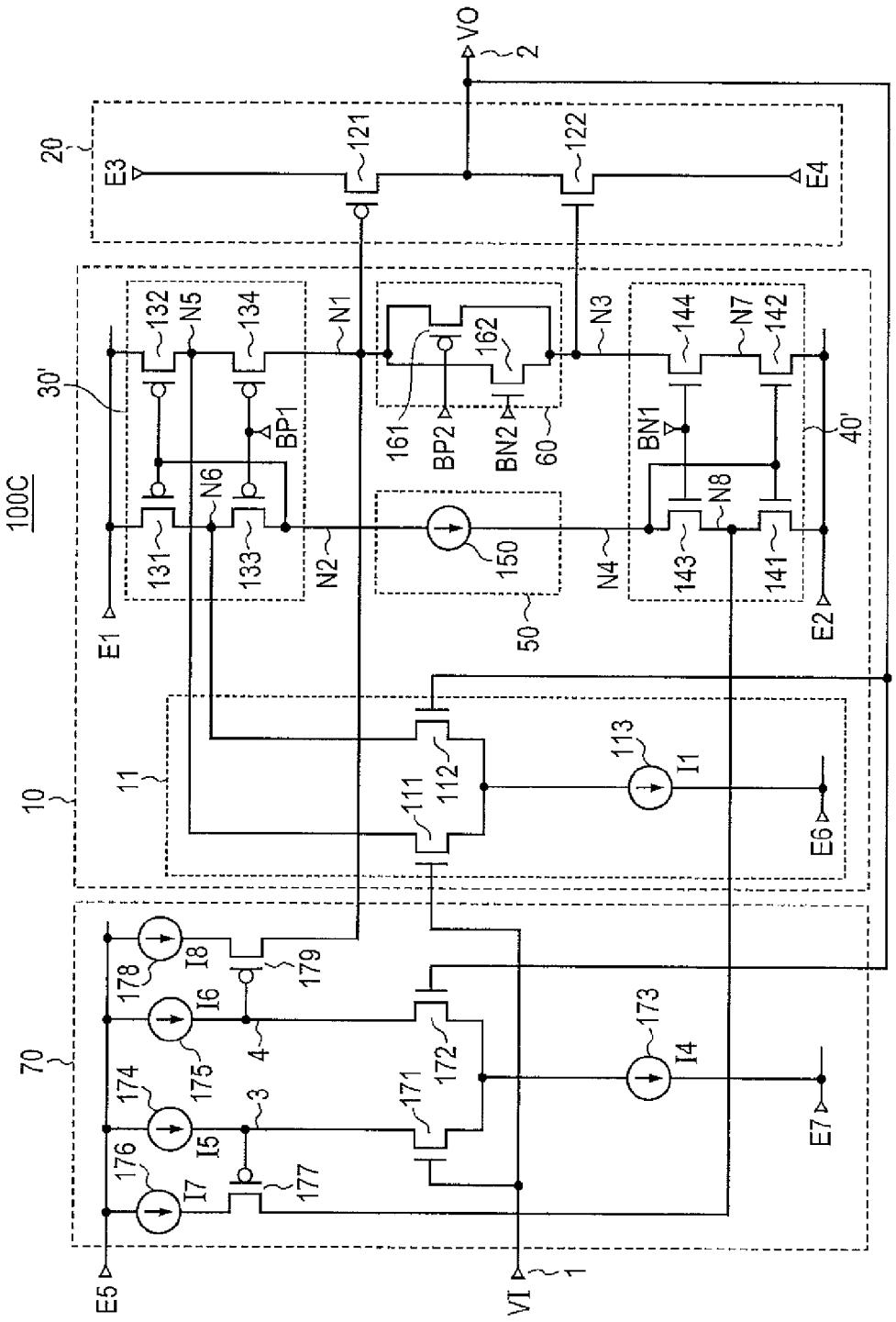
FIG. 3 is a diagram showing a configuration of a third embodiment of the present invention.

Next, a third embodiment of the present invention will be explained. FIG. 3 is a diagram showing a configuration of an output circuit 100C of the third embodiment of the present invention. The output circuit 100C of FIG. 3 is the output circuit 100B of FIG. 2 whose supply destination of the current of the current source 176 of the amplification boost circuit 70 is changed. In FIG. 3, the current source 176 of the amplification boost circuit 70 is coupled to a coupling point (a node N8) of the Nch transistors 141, 143 of the Nch current mirror 40' through the Pch transistor 177. Other configurations are the same as those of FIG. 2.

In FIG. 3, when the voltage difference of the input voltage VI relative to the output voltage VO varies toward the power supply terminal E1 or E5 (high voltage) side to exceed the first value Vt1 (when the voltage difference between the output voltage VO and a voltage of the power supply terminal E5 exceeds the first value Vt1 as compared with a voltage difference between the input voltage VI and the voltage of the power supply terminal E5), the current I7 of the current source 176 is supplied to the node N8 from the amplification boost circuit 70 in addition to the usual differential amplification operation (the charging operation of the output terminal 2) of the differential amplification stage 10 and the output amplification stage 20.

This increases the input-side current of the Nch current mirror 40' (the drain current of the Nch transistor 141). Although an expansion action of a drain-source voltage of the Nch transistor 141 is produced at this time, since a gate-source voltage of the Nch transistor 143 decreases, the charging action arises to the drain (the node N4) of the Nch transistor 143, and as a result, the potential of the drain (the node N4) of the Nch transistor 143 rises corresponding to an increase of the drain current of the Nch transistor 141. Consequently, the drain current of the Nch transistor 142 whose gate is coupled in common with the Nch transistor 141 increases, and the output current of the Nch current mirror 40' (drain currents of the Nch transistors 142, 144) increases.

The increase action of the output current of the Nch current mirror 40' is the same action as in the case where the current I7 of the current source 176 of the amplification boost circuit 70 is supplied to the node N4 in FIG. 2, and promotes the potential drop of the nodes N3, N1. Therefore, the charging operation of the output terminal 2 is boosted similarly with FIG. 2.

Incidentally, an action of the amplification boost circuit 70 when the voltage difference of the input voltage VI relative to the output voltage VO varies toward the power supply terminal E2 or E7 (low voltage) side to exceed the second value (when the voltage difference between the input voltage VI and the voltage of the power supply terminal E5 exceeds the second value Vt2 as compared with the voltage difference between the output voltage VO and the voltage of the fifth power supply terminal E5) is the same as in FIG. 2, whereby the current I8 of the current source 178 is supplied to the node N1, and as a result, the discharging operation of the output terminal 2 is boosted.

From what was described above, the output circuit 100C of FIG. 3 has the equivalent operation as that of FIG. 2 and has the same characteristic as that of FIG. 2. Incidentally, although the output circuits of FIG. 2 and FIG. 3 differ in a position at which the current I7 from the current source 176 of the amplification boost circuit 70 is combined to an input-side current of the current mirror 40', both of them realize boosting of the charging operation of the output terminal 2 by the action of increasing the input-side current of the current mirror 40'.

Fourth Embodiment

Next, a fourth embodiment of the present invention will be explained. FIG. 4 is a diagram showing a configuration of an output circuit 100D of the fourth embodiment of the present invention. The output circuit 100D of FIG. 4 is of configuration of the output circuit 100A of FIG. 1 in which the supply destination of the current I7 of the current source 176 of the amplification boost circuit 70 is changed and the first floating current source circuit 50 is changed. Other configurations are the same as those of FIG. 1.

In FIG. 4, the current source 176 of the amplification boost circuit 70 is coupled to an input port (the node N2) of the Pch current mirror 30 through the Pch transistor 177. The first floating current source circuit 50 of FIG. 4 is comprised of a Pch transistor 151 and an Nch transistor 152 that are coupled between the nodes N2, N4 in parallel, bias voltages BP3, BN3 are supplied to gates of the Pch transistor 151 and the Nch transistor 152, respectively. The first floating current source circuit 50 (151, 152) is configured so that a current between the nodes N2, N4 may vary by the potential variation of the node N2 or the node N4.

The amplification boost circuit 70 of FIG. 4 is configured so that the potential drops of the nodes N1, N3 may be boosted and the charging operation of the output terminal 2 may be boosted by combining the current I7 (the source current) of the current source 176 to a current that is to be inputted into the first floating current source circuit 50 (151, 152) and by increasing a current value of an input-side current of the Nch current mirror 40 (the drain current of the Nch transistor 141) through the first floating current source circuit 50 (151, 152).

In FIG. 4, when the voltage difference of the input voltage VI relative to the output voltage VO varies toward the high-voltage side to exceed the first value Vt1 (when the voltage difference between the output voltage VO and the voltage of the fifth power supply terminal E5 exceeds the first value Vt1 as compared with the voltage difference between the input voltage VI and the voltage of the fifth power supply terminal E5), the current I7 of the current source 176 is supplied to the node N2 from the amplification boost circuit 70 in addition to the usual differential amplification operation (the charging operation of the output terminal 2) of the differential amplification stage 10 and the output amplification stage 20.

This raises the potential of the node N2, expands a gate-source voltage (absolute value) of the Pch transistor 151 of the first floating current source circuit 50, and increases a drain current (absolute value) of the Pch transistor 151 of the first floating current source circuit 50. The potential of the node N4 also rises accordingly. That is, regarding the nodes N2, N4 coupled through the first floating current source circuit 50 (151, 152), in response to the potential rise of the node N2, the potential of the node N4 also rises in conjunction therewith.

Then, the current I7 of the current source 176 is added to an input current of the Nch current mirror 40 through the first floating current source circuit 50 (151, 152).

The action that the current I7 of the current source 176 is added to the input current of the Nch current mirror 40 is the same action as in FIG. 1, and therefore the charging operation of the output terminal 2 is boosted.

Incidentally, in FIG. 4, the current I8 (source current) of the current source 178 of the amplification boost circuit 70 is supplied to the node N1 similarly with FIG. 1, and an action of the amplification boost circuit 70 when the voltage difference of the input voltage VI relative to the output voltage VO varies toward the power supply terminal E2 (low voltage) side to exceed the second value Vt2 (when the voltage difference between the input voltage VI and the voltage of the power supply terminal E5 exceeds the second value Vt2 as compared with the voltage difference between the output voltage VO and the voltage of the fifth power supply terminal E5) is the same as in FIG. 1, whereby the current I8 of the current source 178 is supplied to the node N1, and as a result, the discharging operation of the output terminal 2 is boosted. As for the details of the action, an explanation of FIG. 1 is referred to.

From the above, the output circuit 100D of FIG. 4 exerts the same action as that of FIG. 1 and has the same characteristic as FIG. 1. Incidentally, although the output circuits of FIG. 1 and FIG. 4 differ in the position at which the current I7 from the current source 176 of the amplification boost circuit 70 is coupled, the both realize boosting of the charging operation of the output terminal 2 by an action of increasing the input-side current of the Nch current mirror 40.

Fifth Embodiment

Figure 5:
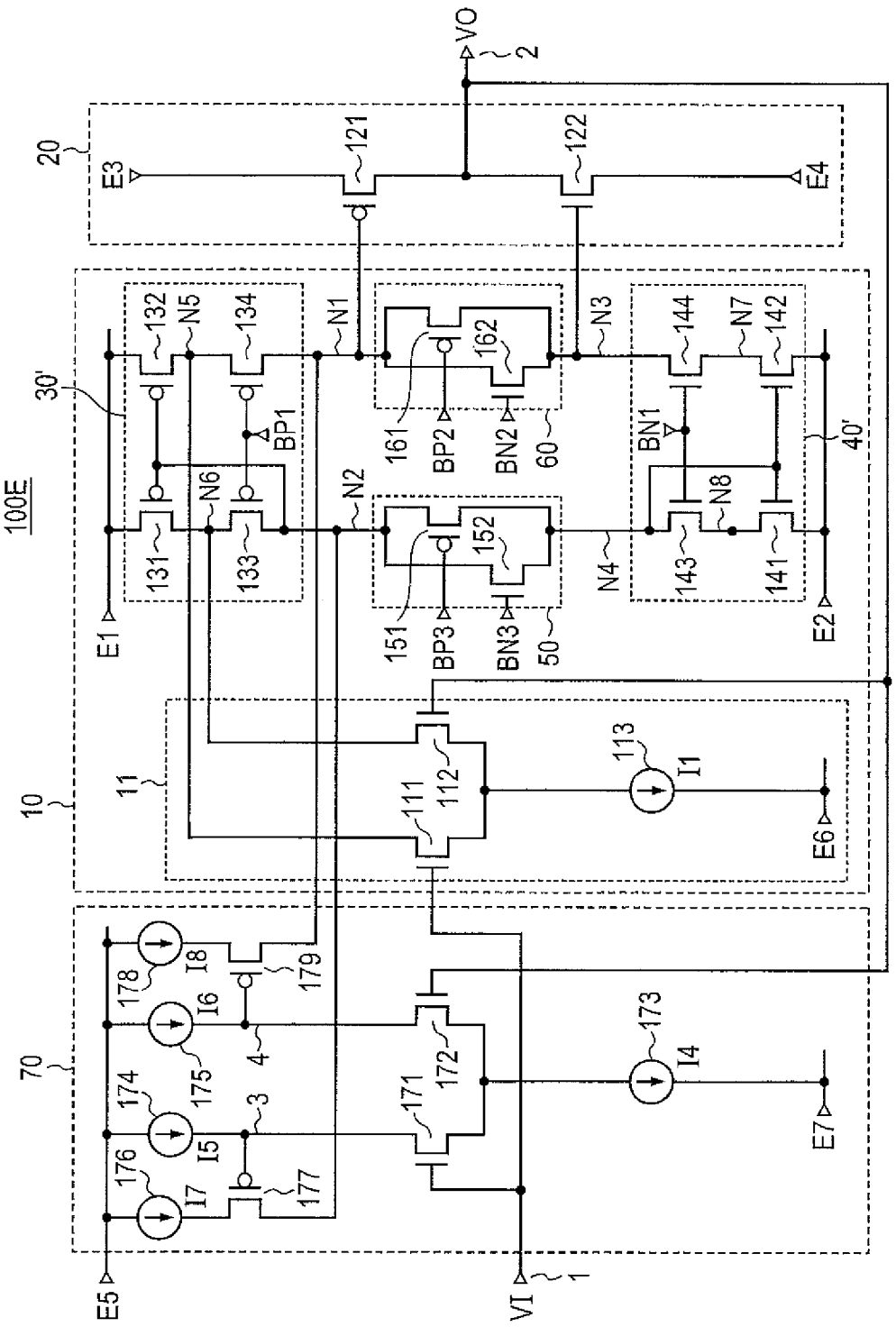
FIG. 5 is a diagram showing a configuration of a fifth embodiment of the present invention.

Next, a fifth embodiment of the present invention will be explained. FIG. 5 is a diagram showing a configuration of an output circuit 100E of the fifth embodiment of the present invention. The output circuit 100E of FIG. 5 has the configuration where the current mirrors 30, 40 of FIG. 4 are changed to the low-voltage cascode current mirrors 30', 40' similarly with FIG. 2, respectively. The current source 176 of the amplification boost circuit 70 is coupled to an input port (the node N2) of the Pch current mirror 30' through the Pch transistor 177. The amplification boost circuit 70 of FIG. 5 is made to be of a configuration of boosting the potential drops of the nodes N1, N3 and boosting the charging operation of the output terminal by combining the current I7 (source current) of the current source 176 to a current that is inputted into the first floating current source circuit 50 (151, 152) from the node N2 and by increasing current values of the input-side currents of the Nch current mirror 40' (the drain currents of the Nch transistors 141, 143) through the first floating current source circuit 50 (151, 152). Therefore, although the output circuit 100E of FIG. 5 differs from the output circuit 100E of FIG. 2 in the position of coupling the current I7 from the current source 176 of the amplification boost circuit 70, the both realize the boosting of the charging operation of the output terminal 2 by the action of increasing the input-side current of the current mirror 40'.

Incidentally, in FIG. 5, the current I8 (source current) of the current source 178 of the amplification boost circuit 70 is supplied to the node N1 similarly with FIG. 2, and the action of the amplification boost circuit 70 is the same as in FIG. 2, whereby boosting of the discharging operation of the output terminal 2 is realized. For details of the action, an explanation of FIG. 2 shall be referred to.

Moreover, in FIG. 5, the current source 176 of the amplification boost circuit 70 may be coupled to a coupling point (the node N6) of the transistors 131, 133 of the Pch current mirror 30' through the Pch transistor 177. When the voltage difference of the input voltage VI relative to the output voltage VO varies toward the high-voltage side to exceed the first value Vt1, the current I7 (source current) of the current source 176 is supplied to the node N6, and the potential of the node N6 rises. At this time, a gate-source voltage (absolute value) of the Pch transistor 133 increases, and a drain current (absolute value) of the Pch transistor 133 increases. That is, the current I7 of the current source 176 increases a current value of the input-side current of the Nch current mirror 40' (the drain currents of the Nch transistors 141, 143) through the Pch transistor 133 and the first floating current source circuit 50 (151, 152), and as a result, the charging operation of the output terminal 2 is boosted.

Sixth Embodiment

Figure 6:
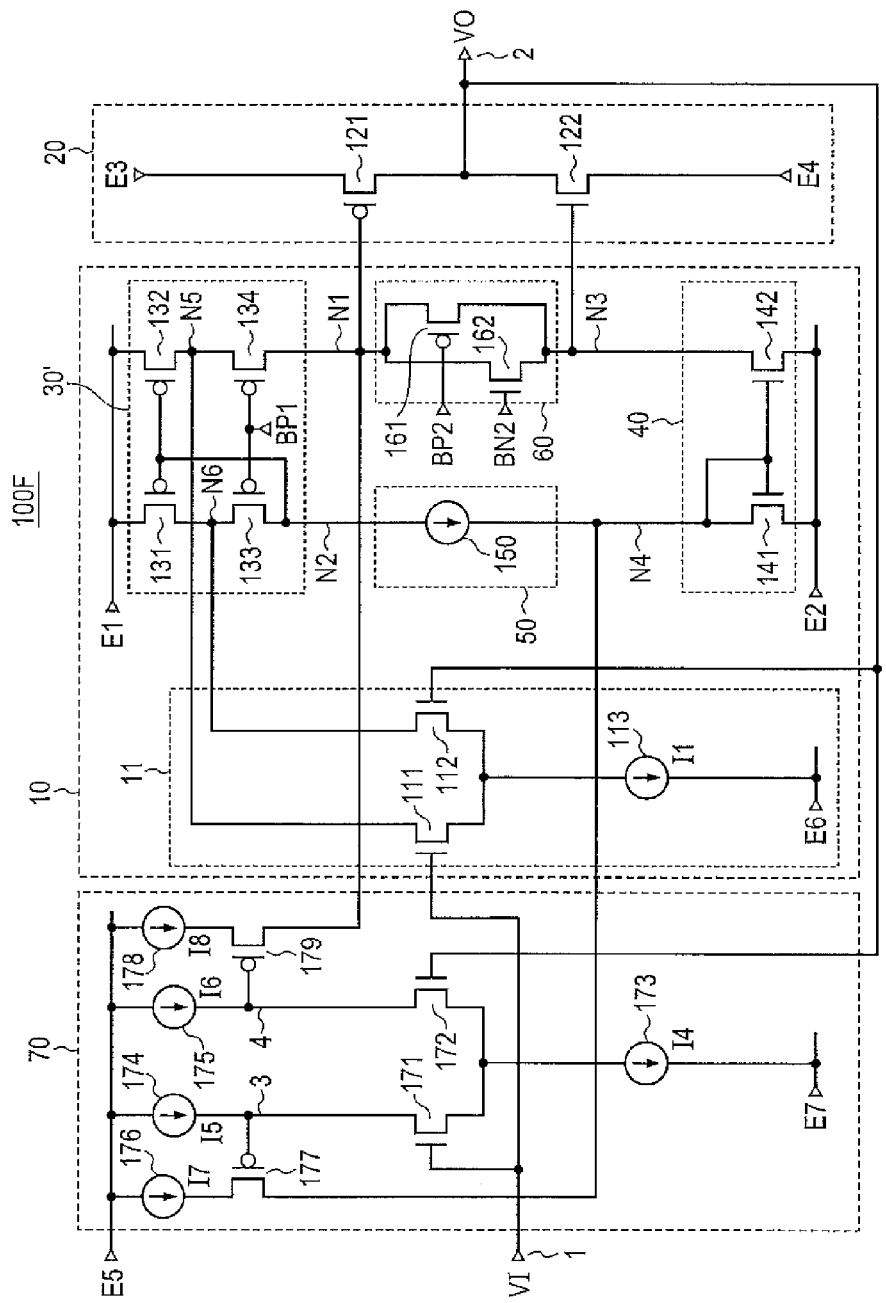
FIG. 6 is a diagram showing a configuration of a sixth embodiment of the present invention.

Next, a sixth embodiment of the present invention will be explained. FIG. 6 is a diagram showing a configuration of an output circuit 100F of the sixth embodiment of the present invention. The output circuit 100F of FIG. 6 is of a configuration of the output circuit of FIG. 2 from which the Nch current mirror 40' (the cascode current mirror) is deleted and to which the Nch current mirror 40 shown in FIG. 1 is provided instead. The Nch current mirror 40' and the Nch current mirror 40 both have the same action, and substitution is possible between each other. Incidentally, also in the output circuits of FIG. 3 and FIG. 5, the Nch current mirror 40' can be replaced with the Nch current mirror 40. However, in the case of the output circuit of FIG. 3, the current I7 of the current source 176 of the amplification boost circuit 70 is supplied to the node N4.

Seventh Embodiment

Figure 7:
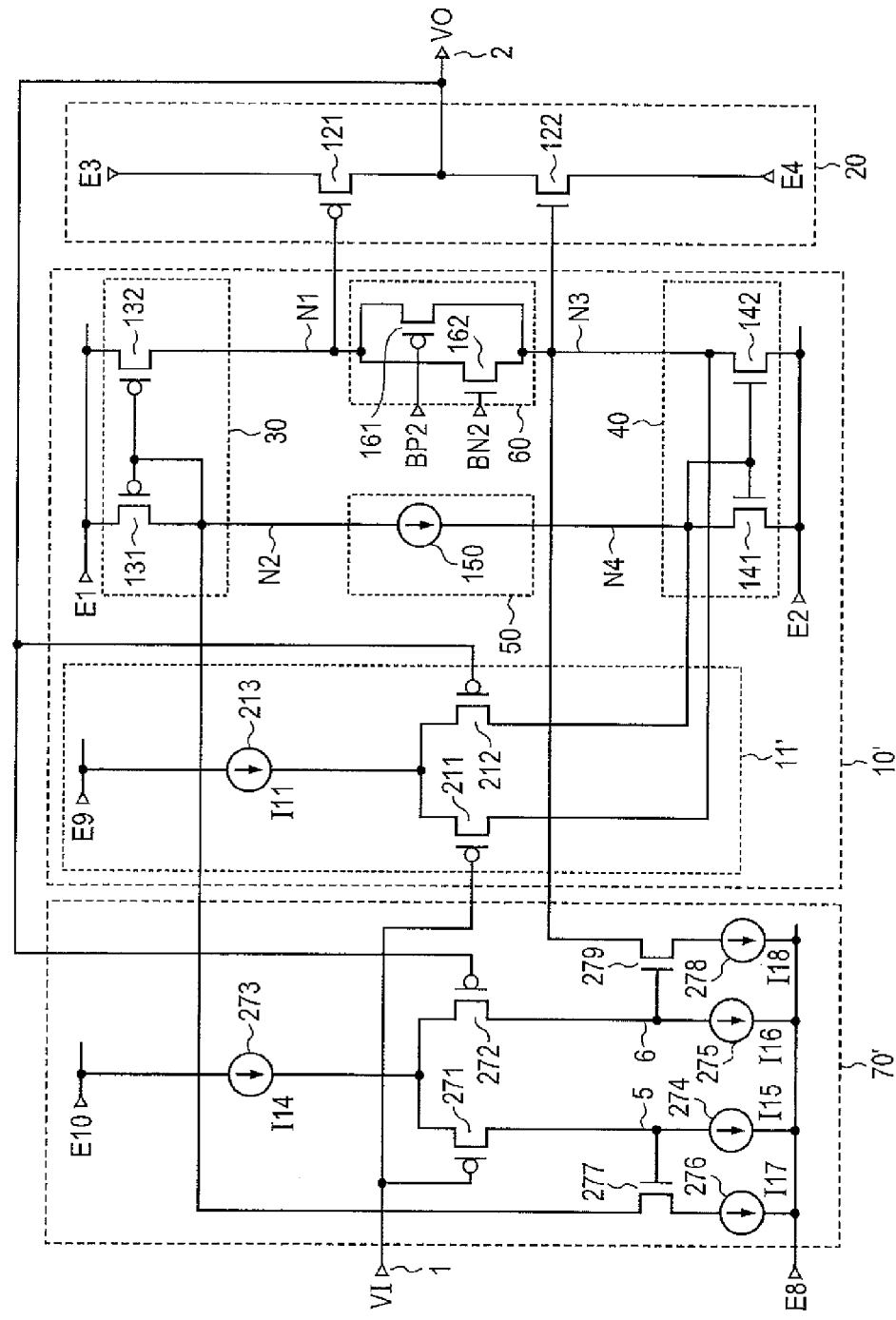
FIG. 7 is a diagram showing a configuration of a seventh embodiment of the present invention.

Next, a seventh embodiment of the present invention will be explained. FIG. 7 is a diagram showing a configuration of an output circuit 200A of the seventh embodiment of the present invention. The output circuit 200A of FIG. 7 is the output circuit 100A of FIG. 1 whose first differential stage 11 including the Nch transistor pair (111, 112) is replaced with a third differential stage 11' including a Pch transistor pair (211, 212). Moreover, the amplification boosting circuit of FIG. 1 is replaced with an amplification boost circuit 70' of a reverse conductivity type.

The third differential stage 11' has the Pch differential transistor pair (211, 212) whose sources are coupled in common, and whose gates are coupled to the input terminal 1 to which the input voltage VI is supplied and the output terminal 2 from which the input voltage VO is outputted, respectively, and a current source 213 coupled between a ninth power supply terminal E9 for giving the high-level power supply voltage and the common sources of the Pch differential transistor pair (211, 212). An output pair (a drain pair) of the Pch differential transistor pair (211, 212) is coupled with the node pair (N3, N4), respectively. Incidentally, a circuit that includes the third differential stage 11', the current mirrors 30, 40, and the floating current source circuits 50, 60 is used as a differential input stage 10'.

The amplification boost circuit 70' has a Pch transistor pair (differential transistor pair) (271, 272) whose sources are coupled together and whose gates are coupled to the input terminal 1 to which the input voltage VI is supplied and the output terminal 2 from which the output voltage VO is outputted, respectively, and a current source 273 whose one end is coupled to the tenth power supply terminal E10 for giving a high-level power supply voltage and whose other end is coupled to commonly coupled sources of the Pch transistor pair (271, 272).

Moreover, the amplification boost circuit 70' has current sources 274, 275 as a load element pair that is coupled between an output pair of the Pch differential transistor pair (271, 272) and an eighth power supply terminal E8 for giving the low-level power supply voltage.

Furthermore, it has a current source 276 and an Nch transistor 277 that are coupled in series between the eighth power supply terminal E8 and the node N2 of the differential input stage 10'. Still furthermore, it has a current source 278 and an Nch transistor 279 that are coupled in series between the eighth power supply terminal E8 and the node N3 of the differential input stage 10'.

A gate of the Nch transistor 277 is coupled to a coupling point 5 of one output of the output pair of the Pch transistor pair (271, 272) (a drain of the Pch transistor 271) and a current source 274. A gate of the Nch transistor 279 is also coupled to a coupling point 6 of the other output of the output pair of the Pch transistor pair (271, 272) (a drain of the Pch transistor 272) and a current source 275.

Incidentally, in FIG. 7, a configuration where the source of the Nch transistor 277 is coupled to the eighth power supply terminal E8 and a current source 276 is coupled between a drain of the Nch transistor 277 and the node N2 may be adopted. A configuration where a source of the Nch transistor 279 is coupled to the eighth power supply terminal E8 and the current source 278 is coupled between the drain of the Nch transistor 279 and the node N3 may be adopted.

Alternatively, a configuration where the Nch transistors 277, 279 are deleted, and activation and deactivation (current outputs at the time of activation, and current stop at the time of deactivation) of the current sources 276, 278 are controlled using potentials of the nodes 5, 6 as the control signals, respectively, may also be adopted.

Incidentally, the load element pair is not limited to current sources, but needs just to be an element capable of varying the potential of the node 5 or 6 in response to the differential output of the Pch differential transistor pair (271, 272) and capable of switching activation and deactivation of the respective current sources 276, 278. Specifically, the current sources 274, 275 that form a load element pair may be replaced with resistance elements (pair) or diodes (pair).

In the output circuit 200A of FIG. 7, the actions of the differential pairs of the differential stage 11' of the differential input stage 10' and of the amplification boost circuit 70' are changed to the actions of the Pch differential pair from the Nch differential pair of the output circuit 100A of FIG. 1, and the charging action and the discharging action of the output terminal 2 are also interchanged. The output circuit 200A is virtually the same as that of FIG. 1 except that the actions are interchanged. Therefore, it has the same performance as the output circuit of FIG. 1.

Specifically, in the differential input stage 10' and the output amplification stage 20, when the input voltage VI varies toward the low-voltage side with respect to the output voltage VO, the gate-source voltages of the Pch differential transistor pairs 211, 212 of the differential input stage 10' expand and reduce, respectively, and drain currents of the transistors 211, 212 increase and decrease, respectively, as compared with time of the stable output state. This decreases the input current (the drain current of the Nch transistor 141) and the output current (the drain current of the Nch transistor 142) of the Nch current mirror 40, raises the potentials of the nodes N1, N3, and produces the discharging action of the output terminal 2 by the output amplification stage 20.

In the amplification boost circuit 70', when the voltage difference of the input voltage VI relative to the output voltage VO varies toward the low-voltage side to exceed the third value Vt3 (the voltage difference between the output voltage VO and a voltage of the eighth power supply terminal E8 exceeds the third value Vt3 as compared with a voltage difference between the input voltage VI and the voltage of the eighth power supply terminal E8), a drain current (absolute value) of the transistor 271 of the Pch differential pair increases, the potential of the node 5 rises, and the current source 276 is activated. This supplies the current I17 of the current source 276 to the node N2, increases the input current (the drain current (absolute value) of the Pch transistor 131) and the output current (the drain current (absolute value) of the Pch transistor 132) of the Pch current mirror 30, boosts the potential rises of the nodes N1, N3, and boosts the discharging action of the output terminal 2 by the output amplification stage 20.

Moreover, in the differential input stage 10' and the output amplification stage 20, when the input voltage VI varies toward the high-voltage side with respect to the output voltage VO, gate-source voltages of the Pch differential transistor pairs 211, 212 of the differential input stage 10' reduce and expand, respectively, and the drain currents of the transistors 211, 212 decrease and increase, respectively as compared with time of output stable state. This increases the input current (the drain current of the Nch transistor 141) and the output current (the drain current of the Nch transistor 142) of the Nch current mirror 40, lowers the potentials of the nodes N1, N3, and produces the charging action of the output terminal 2 by the output amplification stage 20.

In the amplification boost circuit 70', when the voltage difference of the input voltage VI relative to the output voltage VO varies toward the high-voltage side to exceed the fourth value Vt (when the voltage difference between the input voltage VI and the voltage of the eighth power supply terminal E8 exceeds the fourth value Vt4 as compared with a voltage difference between the output voltage VO and the voltage of the eighth power supply terminal E8), a drain current (absolute value) of the transistor 272 of the Pch differential pair increases, the potential of the node 6 rises, and the current source 278 is activated. By this, a current I18 of the current source 278 is supplied to the node N3, which boosts the potential drops of the nodes N1, N3 and boosts the charging action of the output terminal 2 by the output amplification stage 20.

Incidentally, the supply voltages of the power supply terminals in the output circuit 200A of FIG. 7 will be explained. For example, in the case where the configuration of FIG. 7 is used as an output circuit for driving the negative electrode output range of the LCD driver of FIG. 11A, all the power supply voltages of the first, third, ninth, and tenth power supply terminals E1, E3, E9, and E10 can be set to the high-level power supply voltage VDD, and all the power supply voltages of the second, fourth, and eighth power supply terminals E2, E4, and E8 can be set to the low-level power supply voltage VSS.

Moreover, in the case where this output circuit is used as an output circuit for driving the negative electrode output range, when the power supply voltage VMH corresponding to the upper limit of the negative electrode output range near the common voltage (COM) is supplied, the following setting may also be adopted: all the power supply voltages of the second, fourth, and eighth power supply terminals E2, E4, and E8 are set to the low-level power supply voltage VSS, the power supply voltage of the third power supply terminal E3 is set to the medium-level power supply voltage VMH, both of the power supply voltages of the ninth and tenth power supply terminals E9, E10 are set to the high-level power supply voltage VDD, and the power supply voltage of the first power supply terminal E1 is set to the high-level power supply voltage VDD or the medium-level power supply voltage VMH.

By making small the voltage difference between the third and fourth power supply terminals by setting the power supply voltage of the third power supply terminal E3 to the medium-level power supply voltage VMH, power consumption depending on (current×voltage) is reduced, which also brings about a heat generation suppressing effect.

Incidentally, regarding the supply voltages of the ninth and tenth power supply terminals E9, E10 coupled to the ninth and tenth current sources 213, 273 for driving respective Pch differential pairs of the differential input stage 10' and the amplification boost circuit 70', the upper limits of operating ranges of respective Pch differential pairs becomes the supply voltages of the ninth and tenth power supply terminals E9, E10 that are lowered by threshold voltages (absolute values) of the Pch differential transistor pairs (211, 212), (271, 272), respectively.

Even when the threshold voltage (absolute value) of the Pch differential transistor pair is large to some extent, by, setting the ninth and tenth power supply terminals E9, E10 to the high-level power supply voltage VDD, there is no harm in using the output circuit 200A of FIG. 7 as an output circuit for driving the negative electrode output range (VSS to VMH) of the LCD driver of FIG. 11A.

Incidentally, as modifications of the second to sixth embodiments shown in FIG. 2 to FIG. 6, it is possible to replace the differential input stage 10 and the amplification boost circuit 70 with the differential input stage 10' and the amplification boost circuit 70' to change the conductivity type of the differential pair, similarly with the seventh embodiment.

Moreover, supply destinations of the currents I17, I18 of the current sources 276, 278 of the amplification boost circuit 70' are changed into the nodes N2, N3 in modifications of the second and sixth embodiments, are changed into the nodes N6, N3 in a modification of the third embodiment, and are changed into the nodes N4, N3 in modifications of the fourth and fifth embodiments.

Eighth Embodiment

Figure 8:
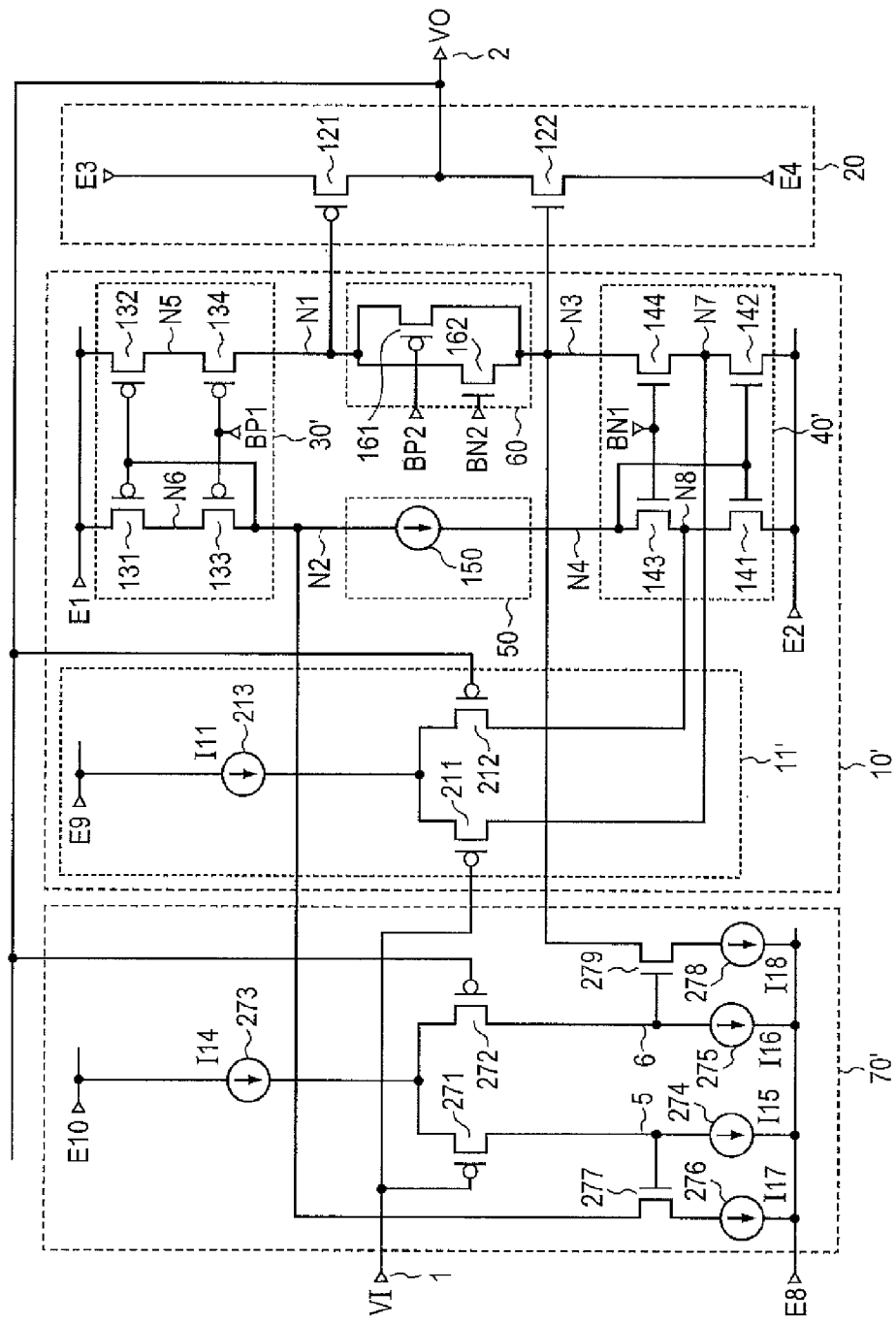
FIG. 8 is a diagram showing a configuration of an eighth embodiment of the present invention.

Next, an eighth embodiment of the present invention will be explained. FIG. 8 is a diagram showing a configuration of an output circuit 200B of the eighth embodiment of the present invention. The output circuit 200B of FIG. 8 is the output circuit 200A of FIG. 7 whose current mirrors 30, 40 of FIG. 7 are changed into the low-voltage cascode current mirrors 30', 40' of FIG. 2.

The current mirrors 30, 40 and the low-voltage cascode current mirrors 30', 40' have an equivalent function, and the output circuit 200B has an action equivalent to that of the output circuit 200A.

Ninth Embodiment

Figure 9:
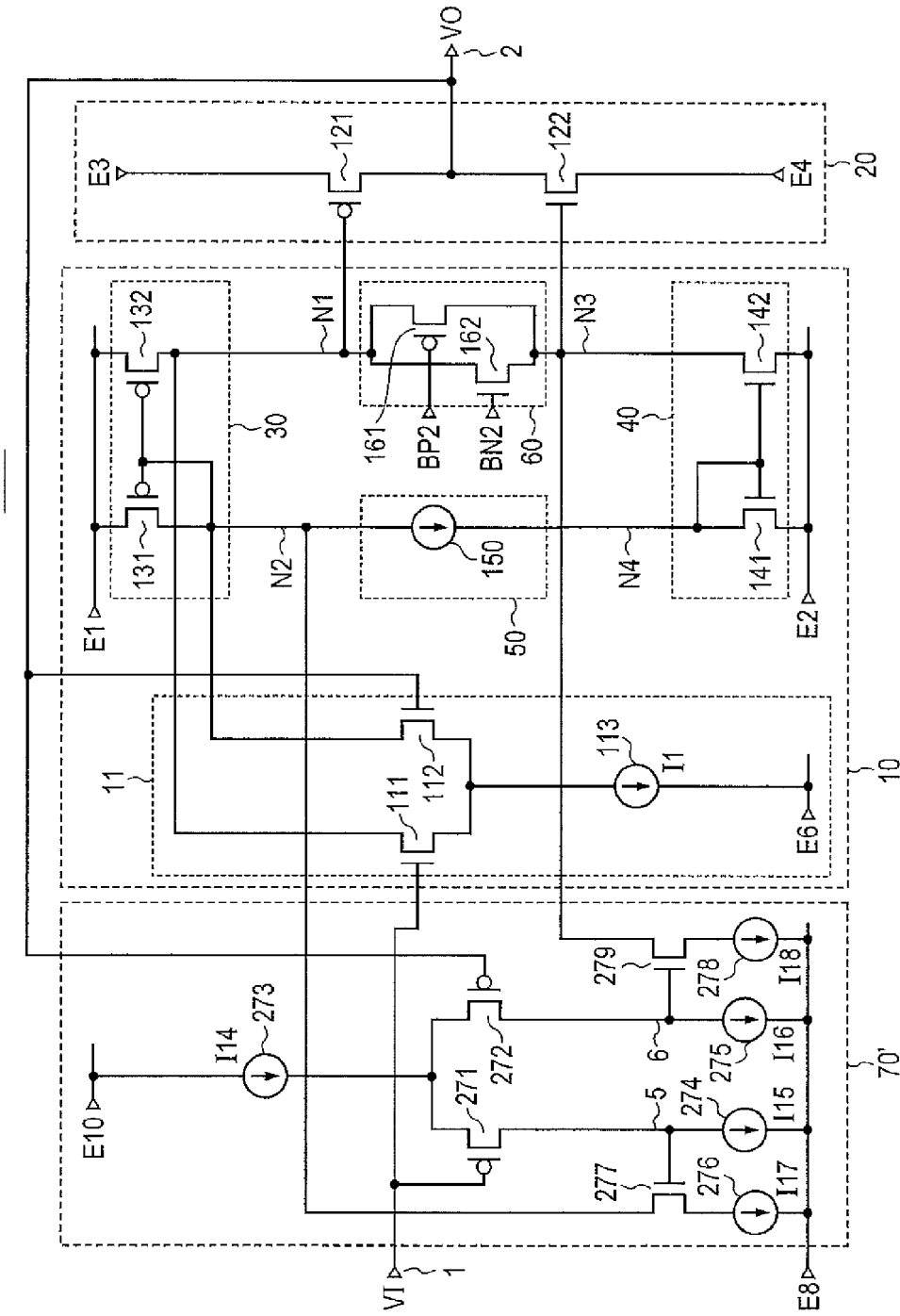
FIG. 9 is a diagram showing a configuration of a ninth embodiment of the present invention.

Next, a ninth embodiment of the present invention will be explained. FIG. 9 is a diagram showing a configuration of an output circuit 300A of the ninth embodiment of the present invention. The output circuit 300A of FIG. 9 is of a configuration of the output circuit 100A of FIG. 1 whose amplification boost circuit 70 is replaced with the amplification boost circuit 70' of FIG. 7. The supply destinations of the currents I17, I18 of the current sources 276, 278 of the amplification boost circuit 70' are the nodes N2, N3, respectively. A combination of the differential input stage 10 and the amplification boost circuit 70' that are mutually different in the conductivity type of the each differential pair, like the output circuit 300A of FIG. 9, is also possible. Similarly, a combination of the differential input stage 10' and the amplification boost circuit 70 is also possible.

Tenth Embodiment

Figure 10:
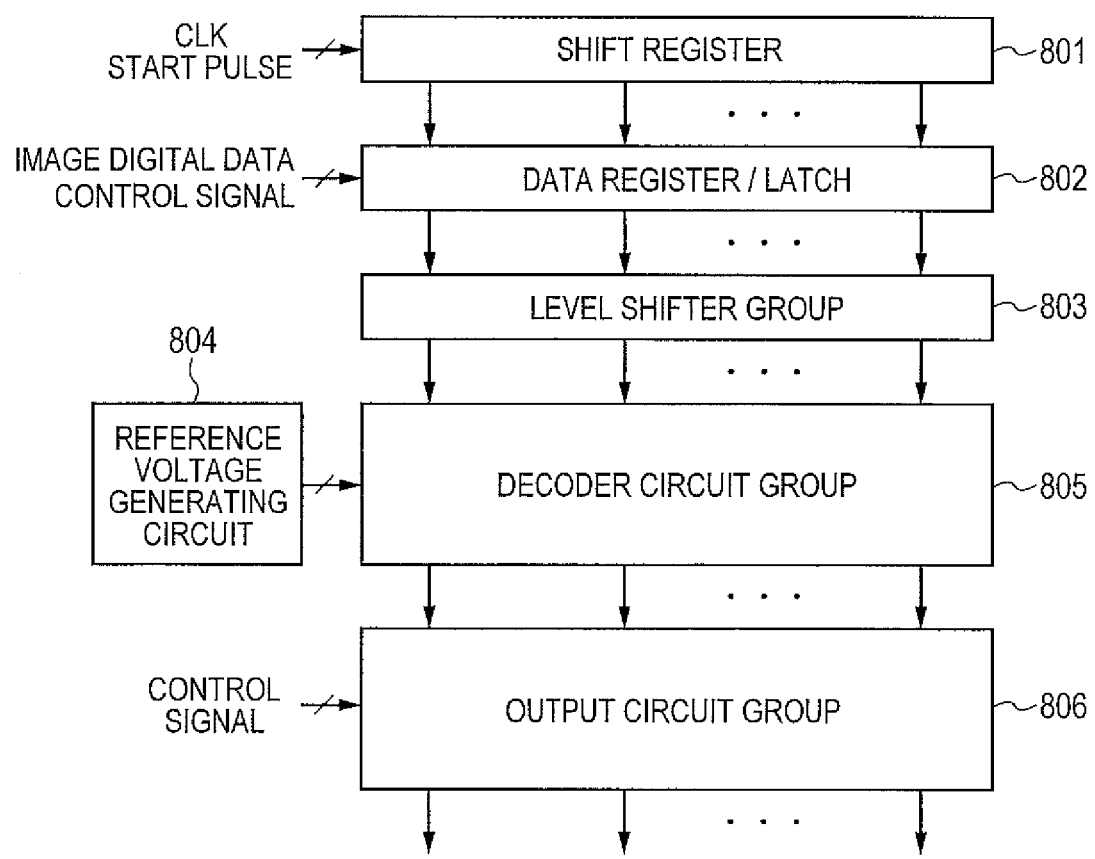
FIG. 10 is a diagram showing a configuration of a data driver of a display device.

FIG. 10 is a diagram showing a configuration of a principal part of a data driver of a display device of a tenth embodiment of the present invention. Referring to FIG. 10, the data driver corresponds, for example, to a data driver 980 of FIG. 12A. Referring to FIG. 10, this data driver is comprised of a shift register 801, a data register/latch 802, a level shifter group 803, a reference voltage generating circuit 804, a decoder circuit group 805, and an output circuit group 806.

Each output circuit of the output circuit group 806 can use the output circuit of the embodiments explained so far with reference to FIG. 1 to FIG. 9. The output circuit group 806 has the multiple output circuits, corresponding to the number of outputs.

The shift register 801 decides a timing of latching data based on a start pulse and a clock signal CLK. The data register/latch 802 develops inputted image digital data to digital data signals of respective output units based on the timing decided by the shift register 801, and latches them for a predetermined number of outputs, and outputs them to the level shifter group 803 according to the control signal.

The level shifter group 803 performs level conversion on the digital data signal of each output unit outputted from the data register/latch 802 from a low amplitude signal to a high amplitude signal, and outputs them to the decoder group 805.

The decoder circuit group 805 selects one or more reference voltages corresponding to the digital data signal having been subjected to the level conversion from a group of reference voltages generated by the reference voltage generating circuit 804 for each output. The output circuit group 806 inputs therein one or plural reference voltages selected by a corresponding decoder of the decoder circuit group 805 and amplifies and outputs a gradation signal corresponding to the reference voltage for each output. The output terminal group of the output circuit group 806 is coupled to the data lines of the display device.

The shift register 801 and the data register/latch 802 are each comprised of logic circuits, each of which is formed to operate with a low voltage (for example, it operates with the power supply voltage of 0 to 3.3 V) and is supplied a corresponding supply voltage. The level shifter group 803, the decoder circuit group 805, and the output circuit group 806 are configured to operate at high voltages generally required to drive the display elements (for example, 0 V (VSS) to 18 V (VDD)) and are supplied corresponding power supply voltages.

Each of the output circuits of the embodiments explained with reference to FIG. 1 to FIG. 9 is made capable of boosting the charging operation and the discharging operation of the data line coupling to the output terminal of the output circuit, capable of realizing waveform symmetry at the time of the charging and at the time of discharging, and suitable to curtail its area and power consumption; therefore, each of them is suitably configured as each output circuit of the output circuit group 806 of the data driver of the display device.

According to this embodiment, it is made possible to realize the data driver and the display device both capable of high-speed driving with low power consumption.

Incidentally, each disclosure of the above-mentioned patent documents and nonpatent documents shall be included into this specification by reference. Within a frame of all the disclosures of the present invention (including what is claimed), and based on its fundamental technical thoughts, the embodiment or the example can be altered or adjusted. Moreover, within the frame of what is claimed of the present invention, various disclosed elements (including each element of each claim, each element of each embodiment, each element of each drawing, etc.) can variously be combined or selected. That is, it is natural that the present invention includes various modifications and corrections that a person skilled in the art could perform according to all the disclosures and technical thoughts including the claims.

What is claimed is:

1. An output circuit comprising:
    a differential input stage;
    an output amplification stage;
    an amplification boost circuit;
    an input terminal;
    an output terminal; and
    first to fifth power supply terminals,
    wherein the first differential pair includes:
    a first differential pair having a transistor pair that inputs therein an input signal of the input terminal and an output signal of the output terminal in a differential mode;
    a first current source for driving the first differential pair;
    a first current mirror including a transistor pair of a first conductivity type that is coupled between the first power supply terminal and first and second nodes and receives an output current of the first differential pair;
    a second current mirror including a transistor pair of a second conductivity type that is coupled between the second power supply terminal and third and fourth nodes;

a first floating current source circuit coupled between the second node to which an input of the first current mirror is coupled and the fourth node to which an input of the second current mirror is coupled; and a second floating current source circuit coupled between the first node to which an output of the first current mirror is coupled and the third node to which an output of the second current mirror is coupled;

wherein the output amplification stage includes:

a first transistor of the first conductivity type that is coupled between the third power supply terminal and the output terminal and whose control terminal is coupled to the first node; and a second transistor of the second conductivity type that is coupled between the fourth power supply terminal and the output terminal and whose control terminal is coupled to the third node;

wherein the amplification boost circuit includes:

a second differential pair having a transistor pair that inputs therein an input signal of the input terminal and an output signal of the output terminal in a differential mode, and second and third current sources coupled to the fifth power supply terminal, and wherein when a voltage difference between the output voltage of the output terminal and a voltage of the fifth power supply terminal is larger than a previously set first value as compared with a voltage difference between the input voltage of the input terminal and the voltage of the fifth power supply terminal, the amplification boost circuit deactivates the third current source according to an output of one transistor of the transistor pair whose input is coupled to the output terminal in the second differential pair, activates the second current source according to an output of the other transistor of the transistor pair whose input is coupled to the input terminal in the second differential pair, and combines a current from the second current source to either current of an input current inputted to the first floating current source circuit or a current outputted from the first floating current source circuit, wherein when the voltage difference between the input voltage of the input terminal and the voltage of the fifth power supply terminal is larger than a previously set second value as compared with the voltage difference between the output voltage of the output terminal and the voltage of the fifth power supply terminal, the amplification boost circuit deactivates the second current source according to an output of the other transistor of the transistor pair whose input is coupled to the input terminal in the second differential pair, activates the third current source according to an output of the one transistor of the transistor pair whose input is coupled to the output terminal in the second differential pair, and combines a current from the third current source to either current of a current inputted into the second floating current source circuit or a current outputted from the second floating current source circuit, and wherein when the voltage difference between the output voltage of the output terminal and the voltage of the fifth power supply terminal is less than or equal to the first value as compared with the voltage difference between the input voltage of the input terminal and the voltage of the fifth power supply terminal and, at the same time, the voltage difference between the input voltage of the input terminal and the voltage of the fifth power supply terminal is less than or equal to the second value as compared with the voltage difference between the output voltage of the output terminal and the voltage of the fifth power supply terminal, the amplification boost circuit controls switching so that both of the second and third current sources are deactivated.

2. An output circuit comprising:

a differential input stage;

an output amplification stage;

an amplification boost circuit;

an input terminal;

an output terminal; and first to fifth power supply terminals, wherein the differential input stage is driven by a first current source, and includes:

a first differential pair comprised of a transistor pair whose input pair is coupled to the input terminal and the output terminal, respectively;

a first current mirror including a transistor pair of a first conductivity type that is coupled to the first power supply terminal and between an output pair of the first differential pair;

a second current mirror including a transistor pair of a second conductivity type that is coupled to the second power supply terminal;

a first floating current source circuit coupled between second and fourth nodes to which inputs of the first and second current mirrors are coupled, respectively; and a second floating current source circuit coupled between first and third nodes to which outputs of the first and second current mirrors are coupled, respectively;

wherein the output amplification stage includes:

an output transistor of the first conductivity type that is coupled between the third power supply terminal and the output terminal and whose control terminal is coupled to the first node; and an output transistor of the second conductivity type that is coupled between the forth power supply terminal and the output terminal and whose control terminal is coupled to the third node, and wherein the amplification boost circuit includes:

a second differential pair including a transistor pair of the second conductivity type that is driven by a second current source and whose input pair is coupled to the input terminal and the output terminal, respectively; and a load element pair that is coupled to the fifth power supply terminal and between the output pair of the second differential pair; and further includes:

a first current source circuit that is coupled between a previously determined any one of nodes of the fourth node, the second node, and a terminal of the transistor on the input side of the transistor pair of the second conductivity type of the second current mirror opposite to the second power supply terminal thereof and the fifth power supply terminal, is controlled in activation according to a voltage of the output of the second conductivity type transistor whose input is coupled to the input terminal in the second differential pair, and controls current supply to the one node; and a second current source circuit that is coupled between the fifth power supply terminal and the first node, is controlled in activation according to the voltage of the output of the second conductivity type transistor whose input is coupled to the output terminal in the second differential pair, and controls current supply to the first node.

3. An output circuit comprising:
a differential input stage;
an output amplification stage;
an amplification boost circuit;
an input terminal, an output terminal; and
first to fifth power supply terminals,
wherein the differential input stage includes:
a first differential pair that is driven by a first current source and is comprised of a transistor pair whose input pair is coupled to the input terminal and the output terminal, respectively;
a first current mirror including a transistor pair of a first conductivity type coupled between the first power supply terminal and an output pair of the first differential pair;
a second current mirror including a transistor pair of a second conductivity type coupled to the second power supply terminal;
a first floating current source circuit coupled between second and fourth nodes to which inputs of the first and second current mirrors are coupled, respectively; and
a second floating current source circuit coupled between first and third nodes to which outputs of the first and second current mirrors are coupled, respectively,
wherein the output amplification stage includes:
an output transistor of the first conductivity type that is coupled between the third power supply terminal and the output terminal and whose control terminal is coupled to the first node; and
an output transistor of the second conductivity type that is coupled between the fourth power supply terminal and the output terminal and whose control terminal is coupled to the third node, and
wherein the amplification boost circuit includes:
a second differential pair that is driven by a second current source and is comprised of a transistor pair of the first conductivity type whose input pair is coupled to the input terminal and the output terminal, respectively;
a first current source circuit that has a load element pair that is coupled between the fifth power supply terminal and an output pair of the second differential pair, respectively, is coupled between the second node and the fifth power supply terminal, is controlled in activation according to an output voltage of the first conductivity type transistor whose input is coupled to the input terminal in the second differential pair, and controls current supply to the second node; and
a second current source circuit that is coupled between the fifth power supply terminal and the third node, is controlled in activation according to an output voltage of the first conductivity type transistor whose input is coupled to the output terminal in the second differential pair, and controls current supply to the third node.

4. The output circuit according to claim 1,
wherein the amplification boost circuit includes the second current source coupled between the fifth power supply terminal and a predetermined node on the input side of the second current mirror, and
wherein the amplification boost circuit includes the third current source coupled between the fifth power supply terminal and the first node, and
when the voltage difference between the output voltage and the voltage of the fifth power supply terminal is larger than the first value as compared with the voltage difference between the input voltage and the voltage of the fifth power supply terminal, the third current source is deactivated according to an output of the one transistor of the transistor pair whose input is coupled to the output terminal in the second differential pair, and
the amplification boost circuit activates the second current source according to an output of the other transistor of the transistor pair whose input is coupled to the input terminal in the second differential pair and combines a current from the second current source to an input-side current of the second current mirror,
when the voltage difference between the input voltage and the voltage of the fifth power supply terminal is larger than the second value as compared with voltage difference of the output voltage and the voltage of the fifth power supply terminal,
the second current source is deactivated according to an output of the other transistor of the transistor pair whose input is coupled to the input terminal in the second differential pair, and
the amplification boost circuit activates the third current source according to an output of the one transistor of the transistor pair whose input is coupled to the output terminal in the second differential pair and combines a current from the third current source to an output current of the first current mirror, and
wherein when the voltage difference between the output voltage and the voltage of the fifth power supply terminal is less than or equal to the first value as compared with the voltage difference between the input voltage and the voltage of the fifth power supply terminal and, at the same time, the voltage difference between the input voltage and the voltage of the fifth power supply terminal is less than or equal to the second value as compared with the voltage difference between the output voltage and the voltage of the fifth power supply terminal, the amplification boost circuit controls switching so that both of the second and third current sources may be deactivated.

5. The output circuit according to claim 4,
wherein the amplification boost circuit includes the second current source and a first switch coupled in series between the fifth power supply terminal and a predetermined node on the input side of the second current mirror, and comprises the third current source and a second switch coupled in series between the fifth power supply terminal and the first node,
wherein when the voltage difference between the output voltage and the voltage of the fifth power supply terminal is larger than the first value as compared with the voltage difference between the input voltage and the voltage of the fifth power supply terminal, the first switch is set on,
wherein when the voltage difference between the input voltage and the voltage of the fifth power supply terminal is larger than the second value as compared with the voltage difference between the output voltage and the voltage of the fifth power supply terminal, the second switch is set on, and
wherein when the voltage difference between the output voltage and the voltage of the fifth power supply terminal is less than or equal to the first value as compared with the voltage difference between the input voltage and the voltage of the fifth power supply terminal and, at the same time, the voltage difference between the input voltage and the voltage of the fifth power supply terminal is less than or equal to the second value as compared with the voltage difference between the output voltage and the voltage of the fifth power supply terminal, both of the first and second switches are set off.

6. The output circuit according to claim 4, wherein the amplification boost circuit includes:
first and second load elements and the second and third current sources whose one ends are coupled in common to the fifth power supply terminal, respectively;
the second differential pair having a transistor pair that inputs therein the input signal of the input terminal and the output signal of the output terminal in a differential mode and whose output pair is coupled to respective other ends of the first and second load elements;
a fourth current source for driving the second differential pair;
a fourth transistor of the first conductivity type that has a first terminal coupled to the other end of the second current source, a second terminal coupled to a previously determined node of the second current mirror and a control terminal coupled to a coupling point of the other end of the first load element and one output of the output pair of the second differential pair; and
a fifth transistor of the first conductivity type that has a first terminal coupled to the other end of the third current source, a second terminal coupled to the first node, and a control terminal coupled to a coupling point of the other end of the second load element and the other output of the output pair of the second differential pair.

7. The output circuit according to claim 1,
wherein the amplification boost circuit includes the second current source coupled between the fifth power supply terminal and a predetermined node on the input side of the first current mirror, and third current source coupled between the fifth power supply terminal and the first node, and
when the voltage difference between the output voltage and the voltage of the fifth power supply terminal is larger than the first value as compared with the voltage difference between the input voltage and the voltage of the fifth power supply terminal, the third current source is deactivated according to an output of the one transistor of the transistor pair whose input is coupled to the output terminal in the second differential pair, and
the amplification boost circuit activates the second current source according to an output of the other transistor of the transistor pair whose input is coupled to the input terminal in the second differential pair and combines a current from the second current source to an input-side current of the first current mirror,
when the voltage difference between the input voltage and the voltage of the fifth power supply terminal is larger than the second value as compared with the voltage difference between the output voltage and the voltage of the fifth power supply terminal, the second current source is deactivated according to an output of the other transistor of the transistor pair whose input is coupled to the input terminal in the second differential pair, and
the amplification boost circuit activates the third current source according to an output of the one transistor of the transistor pair whose input is coupled to the output terminal in the second differential pair and combines a current from the third current source to an output current of the first current mirror, and
wherein when the voltage difference between the output voltage and the voltage of the fifth power supply terminal is less than or equal to the first value as compared with the voltage difference between the input voltage and the voltage of the fifth power supply terminal and, at the same time, the voltage difference between the input voltage and the voltage of the fifth power supply terminal is less than or equal to the second value as compared with the voltage difference between the output voltage and the voltage of the fifth power supply terminal, the amplification boost circuit controls switching so that both of the second and third current sources may be deactivated.

8. The output circuit according to claim 7,
wherein the amplification boost circuit includes:
the second current source and a first switch coupled in series between the fifth power supply terminal and a predetermined node on the input side of the first current mirror, and comprises the third current source and a second switch coupled in series between the fifth power supply terminal and the first node,
wherein when the voltage difference between the output voltage and the voltage of the fifth power supply terminal is larger than the first value as compared with the voltage difference of the input voltage and the voltage of the fifth power supply terminal, the first switch is set on,
wherein when the voltage difference between the input voltage and the voltage of the fifth power supply terminal is larger than the second value as compared with the voltage difference of the output voltage and the voltage of the fifth power supply terminal, the second switch is set on, and
wherein when the voltage difference between the output voltage and the voltage of the fifth power supply terminal is less than or equal to the first value as compared with the voltage difference of the input voltage and the voltage of the fifth power supply terminal and, at the same time, the voltage difference between the input voltage and the voltage of the fifth power supply terminal is less than or equal to the second value as compared with the voltage difference between the output voltage and the voltage of the fifth power supply terminal, both of the first and second switches are set off.

9. The output circuit according to claim 7,
wherein the amplification boost circuit includes:
first and second load elements and the second and third current sources whose one ends are coupled in common to the fifth power supply terminal;
the second differential pair that inputs therein the input signal of the input terminal and the output signal of the output terminal and has a transistor pair whose output pair is coupled to the other ends of the first and second load elements;
a fourth current source for driving the second differential pair;
a fourth transistor of the first conductivity type that has a first terminal coupled the other end of the second current source, a second terminal coupled to a previously determined node on the input side of the first current mirror, and a control terminal that is coupled to a coupling point of the other end of the first load element and one output of the output pair of the second differential pair; and
a fifth transistor of the first conductivity type that has a first terminal coupled to the other end of the third current source, a second terminal coupled to the first node, and a control terminal coupled to a coupling point of the other end of the second load element and the other output of the output pair of the second differential pair.

10. The output circuit according to claim 1,
wherein the amplification boost circuit includes:
the second current source coupled between the fifth power supply terminal and a predetermined node on the input side of the first current mirror, and the third current source coupled between the fifth power supply terminal and the third node, and
when the voltage difference between the output voltage and the voltage of the fifth power supply terminal is larger than the first value as compared with the voltage difference between the input voltage and the voltage of the fifth power supply terminal, the third current source is deactivated according to an output of the one transistor of the transistor pair whose input is coupled to the output terminal in the second differential pair, and
the amplification boost circuit activates the second current source according to an output of the other transistor of the transistor pair whose input is coupled to the input terminal in the second differential pair, and combines a current from the second current source to an input-side current of the first current mirror,
when the voltage difference between the input voltage and the voltage of the fifth power supply terminal is larger than the second value as compared with the voltage difference of the output voltage and the voltage of the fifth power supply terminal, the second current source is deactivated according to an output of the other transistor of the transistor pair whose input is coupled to the input terminal in the second differential pair, and
the amplification boost circuit activates the third current source according to an output of the one transistor of the transistor pair whose input is coupled to the output terminal in the second differential pair, and combines a current from the third current source to an output current of the second current mirror, and
wherein when the voltage difference between the output voltage and the voltage of the fifth power supply terminal is less than or equal to the first value as compared with the voltage difference between the input voltage and the voltage of the fifth power supply and, at the same time, the voltage difference between the input voltage and the voltage of the fifth power supply terminal is less than or equal to the second value as compared with the voltage difference between the output voltage and the voltage of the fifth power supply terminal, the amplification boost circuit controls switching so that both of the second and third current sources may be deactivated.

11. The output circuit according to claim 10,
wherein the amplification boost circuit includes:
the second current source and a first switch coupled in series between the fifth power supply terminal and a predetermined node on the input side of the first current mirror, and
the third current source and a second switch coupled in series between the fifth power supply terminal and the third node,
wherein when the voltage difference between the input voltage and the voltage of the fifth power supply terminal is larger than the first value as compared with the voltage difference between the input voltage and the voltage of the fifth power supply terminal, the first switch is set on, and
wherein when the voltage difference between the input voltage and the voltage of the fifth power supply terminal is larger than the second value as compared with the voltage difference between the output voltage and the voltage of the fifth power supply terminal, the second switch is set on, and
wherein when the voltage difference between the output voltage and the voltage of the fifth power supply terminal is less than or equal to the first value as compared with the voltage difference between the input voltage and the voltage of the fifth power supply terminal and, at the same time, the voltage difference between the input voltage and the voltage of the fifth power supply terminal is less than or equal to the second value as compared with the voltage difference between the output voltage and the voltage of the fifth power supply terminal, both of the first and second switches are set off.

12. The output circuit according to claim 10,
wherein the amplification boost circuit includes:
first and second load elements whose one ends are both coupled to the fifth power supply terminal in common and the second and third current sources;
the second differential pair having a transistor pair that inputs therein the input signal of the input terminal and the output signal of the output terminal in a differential mode and whose output pair is coupled to respective other ends of the first and second load elements;
a fourth current source for driving the second differential pair;
a fourth transistor of the second conductivity type that has a first terminal coupled to the other end of the second current source, a second terminal coupled to a previously determined node on the input side of the first current mirror, and a control terminal coupled to a coupling point of the other end of the first load element and one output of the output pair of the second differential pair; and
a fifth transistor of the second conductivity type that has a first terminal coupled to the other end of the third current source, a second terminal coupled to the third node, and a control terminal coupled to a coupling point of the other end of the second load element and the other output of the output pair of the second differential pair.

13. The output circuit according to claim 1,
wherein the first current mirror includes:
a first-stage transistor pair of the first conductivity type whose first terminals are coupled in common to the first power supply terminal as a transistor pair of the first conductivity type and whose control terminals are coupled together; and
a second-stage transistor pair of the first conductivity type whose first terminals are coupled to second terminals of the first-stage transistor pair of the first conductivity type, respectively, whose second terminals are coupled to the first node and the second node, respectively, and whose control terminals are coupled together;
wherein a second terminal of one transistor of the second-stage transistor pair coupling to the second node is coupled to control terminals of the first-stage transistor pair of the first conductivity type, and an output pair of the first differential pair is coupled to a coupling point pair of the first-stage transistor pair of the first conductivity type and the second-stage transistor pair of the first conductivity type.

14. The output circuit according to claim 1
wherein the second current mirror includes:
a first-stage transistor pair of the second conductivity type whose first terminals are coupled to the second power supply terminal in common as a transistor pair of the second conductivity type and whose control terminals are coupled in common; and a second-stage transistor pair of the second conductivity type whose first terminals are coupled to second terminals of the first-stage transistor pair of the second conductivity type, respectively, whose second terminals are coupled to the third and fourth nodes, respectively, and whose control terminals are coupled together, wherein a second terminal of one transistor of the second-stage transistor pair of the second conductivity type coupling to the fourth node is coupled to control terminals of the first-stage transistor pair of the second conductivity type.

15. The output circuit according to claim 6,
wherein a second terminal of the fourth transistor of the first conductivity type is coupled the fourth node to which an input of the second current mirror is coupled.

16. The output circuit according to claim 6,
wherein the second current mirror includes:

a first-stage transistor pair of the second conductivity whose first terminals are coupled in common to the second power supply terminal and whose control terminals are coupled together; and a second-stage transistor pair of the second conductivity type whose first terminals are coupled to second terminals of the first-stage transistor pair of the second conductivity type, respectively, whose second terminals are coupled to the third node and the fourth node, respectively, and whose control terminals are coupled together, wherein a second terminal of one transistor of the second-stage transistor pair of the second conductivity type coupling to the fourth node is coupled to a control terminal of the first-stage transistor pair of the second conductivity type, and the second terminal of a fourth transistor of the first conductivity type is coupled to a first terminal of one transistor of the second-stage transistor pair coupling to the fourth node.

17. The output circuit according to claim 8,
wherein a second terminal of the fourth transistor of the first conductivity type is coupled to the second node to which an input of the first current mirror is coupled.

18. The output circuit according to claim 12,
wherein a second terminal of the fourth transistor of the second conductivity type is coupled to the second node to which an input of the first current mirror is coupled.

19. The output circuit according to claim 1,
wherein the first floating current source circuit includes a current source, and wherein the second floating current source circuit includes:

a transistor of the first conductivity type that is coupled between the first node and the third node and receives a first bias voltage at its control terminal; and a transistor of the second conductivity type that is coupled between the first node and the third node and receives a second bias voltage at its control terminal.

20. The output circuit according to claim 4,
wherein the first floating current source circuit includes:

a transistor of the first conductivity type that is coupled between the second node and the fourth node and receives a first bias voltage at its control terminal; and a transistor of the second conductivity type that is coupled between the second node and the fourth node and receives a second bias voltage at its control terminal, wherein the second floating current source circuit includes:

a transistor of the first conductivity type that is coupled between the first node and the third node and receives a third bias voltage at its control terminal; and a transistor of the second conductivity type that is coupled between the first node and the third node and receives a fourth bias voltage at its control terminal.

21. A data driver, comprising:

a decoder for outputting a voltage corresponding to image data by decoding inputted image data; and the output circuit according to claim 1 that receives the output voltage of the decoder from its input terminal and whose output terminal is coupled to a data line.

22. A display device comprising the data driver according to claim 21.

* * * * *